(12) United States Patent
Kawahara et al.

(10) Patent No.: US 8,750,032 B2
(45) Date of Patent: Jun. 10, 2014

(54) SEMICONDUCTOR RECORDING DEVICE

(75) Inventors: Takayuki Kawahara, Higashiyamato (JP); Riichiro Takemura, Tokyo (JP); Takashi Ishigaki, Hino (JP); Kiyoo Itoh, Higashikurume (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/643,880

(22) PCT Filed: Apr. 5, 2011

(86) PCT No.: PCT/JP2011/058615
§ 371 (c)(1),
(2), (4) Date: Oct. 26, 2012

(87) PCT Pub. No.: WO2011/135984
PCT Pub. Date: Nov. 3, 2011

(65) Prior Publication Data
US 2013/0051134 A1 Feb. 28, 2013

(30) Foreign Application Priority Data

Apr. 28, 2010 (JP) ................................. 2010-103952

(51) Int. Cl.
*G11C 11/00* (2006.01)
(52) U.S. Cl.
USPC ........................................................ 365/158
(58) Field of Classification Search
USPC ........................................................ 365/158
See application file for complete search history.

(56) References Cited

U.S. PATENT DOCUMENTS

| 2008/0170432 A1* | 7/2008 | Asao .............................. 365/171 |
| 2008/0316798 A1* | 12/2008 | Tanizaki et al. ................ 365/148 |
| 2008/0316819 A1 | 12/2008 | Lee |
| 2009/0257274 A1 | 10/2009 | Itagaki et al. |

(Continued)

FOREIGN PATENT DOCUMENTS

| JP | 2001-229665 A | 8/2001 |
| JP | 2003-78114 A | 3/2003 |

(Continued)

OTHER PUBLICATIONS

T. Kawahara et al.,. "2Mb Spin-Transfer Torque RAM (SPRAM) with Bit-by-Bit Bidirectional Current Write and Parallelizing-Direction Current Read" ISSCC 2007 Digest of Technical Papers pp. 480-481.

(Continued)

*Primary Examiner* — Huan Hoang
*Assistant Examiner* — Pablo Huerta
(74) *Attorney, Agent, or Firm* — Miles & Stockbridge P.C.

(57) ABSTRACT

The disclosed semiconductor recording device achieves multi-valued reading and writing using a spin-injection magnetization-reversal tunneling magnetoresistive element (TMR element). A first current that has at least the same value as that of the element requiring the highest current to reverse the magnetization thereof among a plurality of TMR elements is, in the direction that causes reversal to either a parallel state or an anti-parallel state, applied to a memory cell having the plurality of TMR elements, and then a second current which is in the reverse direction from the first current and of which only the value needed to reverse the magnetoresistance state of at least one TMR element excluding the element requiring the maximum current among the plurality of TMR elements is applied to each, and multi-valued writing is performed.

14 Claims, 34 Drawing Sheets

(56) References Cited

U.S. PATENT DOCUMENTS

| | | |
|---|---|---|
| 2010/0054020 A1 | 3/2010 | Ueda |
| 2010/0118591 A1 | 5/2010 | Sugibayashi |
| 2011/0058406 A1* | 3/2011 | Ma et al. .................... 365/148 |

FOREIGN PATENT DOCUMENTS

| | | |
|---|---|---|
| JP | 2003-179213 A | 6/2003 |
| JP | 2003-229547 A | 8/2003 |
| JP | 2006-156840 A | 6/2006 |
| JP | 2007-281334 A | 10/2007 |
| JP | 2008-243933 A | 10/2008 |
| JP | 2009-259316 A | 11/2009 |
| JP | 2010-34153 A | 2/2010 |
| JP | 2010-061743 A | 3/2010 |
| WO | WO 2008/120480 A1 | 10/2008 |
| WO | WO 2009/108279 A2 | 9/2009 |

OTHER PUBLICATIONS

M. Hosomi et al., "A Novel Nonvolatile Memory with Spin Torque Transfer Magnetization Switching: Spin-RAM", 2005 International Electron Device Meeting Technical Digest Papers pp. 459-462.

* cited by examiner

FIG. 9A  FIG. 9B  FIG. 9C
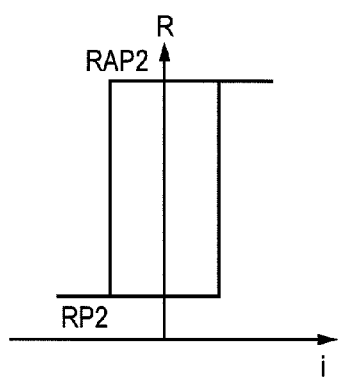
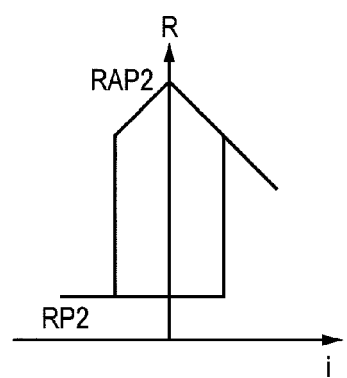
FIG. 10A  FIG. 10B  FIG. 10C
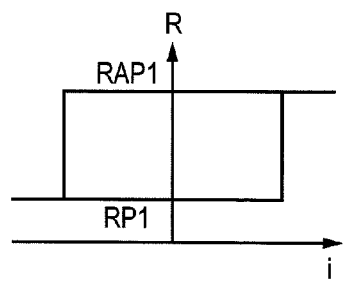
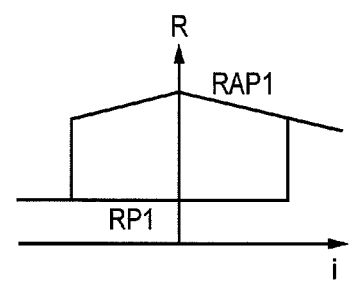
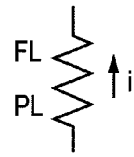

| | | STEP 1 | | | | | | | | STEP 2 | | | | | | | |
|---|---|---|---|---|---|---|---|---|---|---|---|---|---|---|---|---|---|
| OL1 | OL2 | WES1="1", WES2="0" | | | | | | | | WES1="0", WES2="1" | | | | | | | |
| | | PB1 | PB2 | NB1 | NB2 | PS1 | PS2 | NS1 | NS2 | PB1 | PB2 | NB1 | NB2 | PS1 | PS2 | NS1 | NS2 |
| 1 | 1 | 1 | 1 | 1 | 1 | 0 | 0 | 0 | 0 | 1 | 0 | 1 | 0 | 1 | 0 | 1 | 0 |
| 1 | 0 | 1 | 1 | 1 | 1 | 0 | 0 | 0 | 0 | 1 | 0 | 0 | 0 | 1 | 0 | 1 | 1 |
| 0 | 1 | 0 | 0 | 0 | 0 | 1 | 1 | 1 | 1 | 1 | 0 | 1 | 1 | 1 | 0 | 0 | 0 |
| 0 | 0 | 0 | 0 | 0 | 0 | 1 | 1 | 1 | 1 | 1 | 0 | 1 | 0 | 1 | 0 | 1 | 0 |

FIG. 29
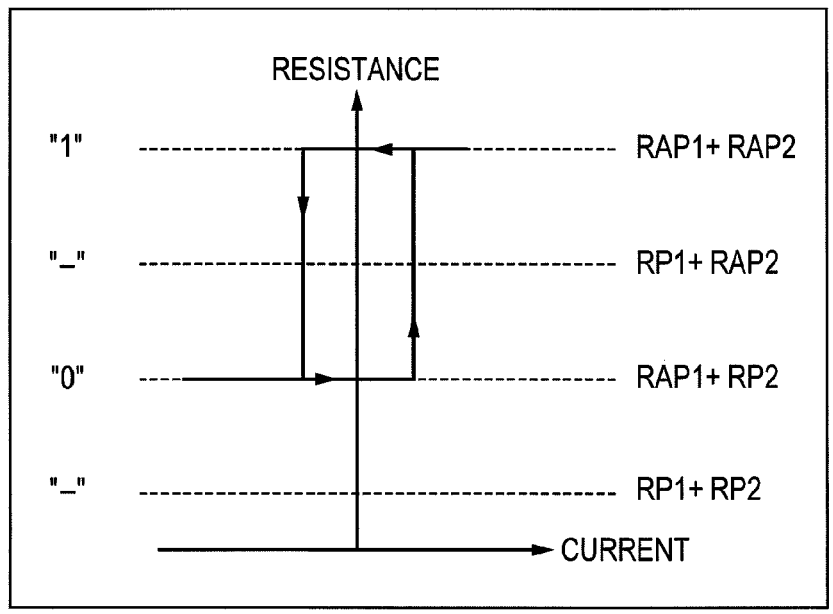
FIG. 30A    FIG. 30B    FIG. 30C
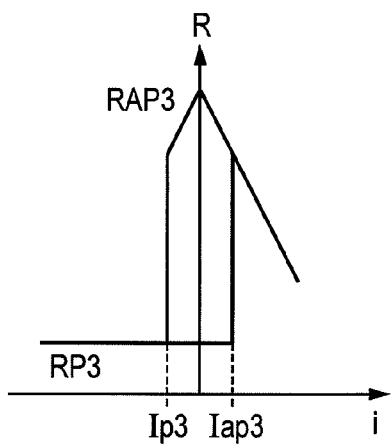 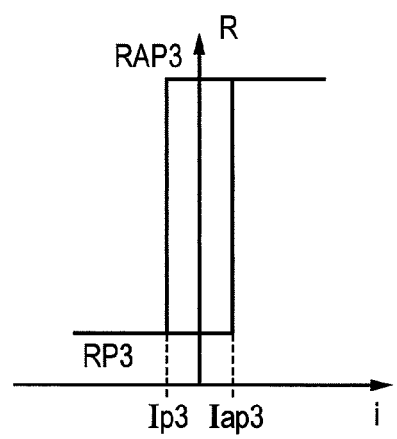 

FIG. 36A
FIG. 36B
FIG. 36C
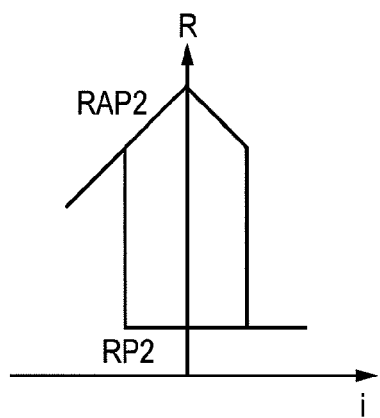
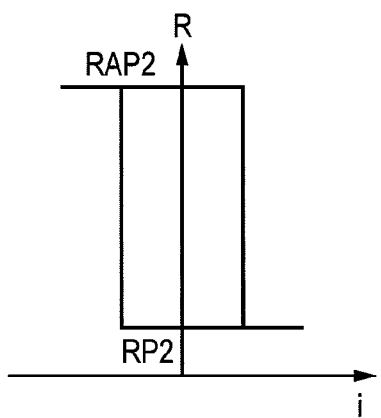
FIG. 37A
FIG. 37B
FIG. 37C
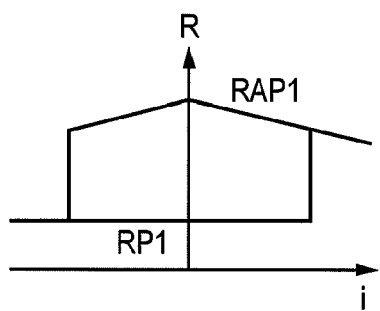
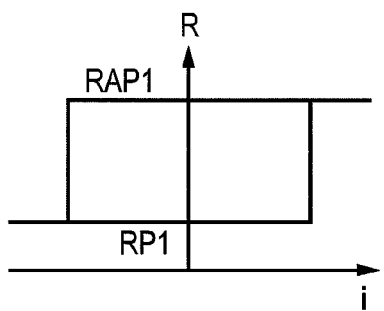
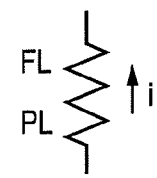

parallel

Anti-parallel

SEMICONDUCTOR RECORDING DEVICE

TECHNICAL FIELD

The present invention relate to a semiconductor recording device, and in particular, to a configuration, and an operation, enabling multi-valued recording in a memory cell array making use of a magneto-resistance change.

BACKGROUND ART

Among nonvolatile memories, a MRAM (Magnetoresistive Random Access Memory) making use of a magneto-resistance change has the potential for becoming a RAM capable of a high-speed operation, and rewriting an unlimited number of times from a practical point of view. The basic element of the MRAM is called a MTJ (Magnetic Tunnel Junction) of a structure incorporating an insulation layer sandwiched between two ferromagnetic layers, the insulation layer serving as a tunneling barrier. Information is recorded by taking advantage of a tunnel magneto-resistance TMR (Tunnel Magneto-Resistance) effect whereby an element resistance largely differs according to parallel or anti-parallel in orientation of respective magnetizations of these two ferromagnetic layers.

A memory cell configuration among MRAMs with a scheme of rewriting magnetization orientation by injection of electrons having two-way of spin polarizations due to magnetization of the ferromagnetic layers, spin-injection magnetization-reversal type, is shown in a circuit diagram of FIG. 43 (a), and a sectional schematic diagram of FIG. 43 (b), respectively. A memory using this scheme is hereinafter referred to as an SPRAM (Spin-transfer torque Random Access Memory). This memory cell is comprised of one piece each of tunneling magneto-resistance element TMR, selection transistor MCT for reading, word line WL, bit line BL, and source line SL. The tunnel magneto-resistance element TMR includes at least two magnetic layers, one thereof being made up of a fixed layer PL where a spin orientation is fixed, while the other thereof being made up of a free layer FL where a spin orientation assumes either of two states, including an anti-parallel state {FIG. 44 (a)} against the fixed layer, and a parallel state {FIG. 44 (b)} against the fixed layer, as shown in FIG. 44. A tunnel barrier film TB is present between these films. For the tunnel barrier film TB, use is made of MgO, and so forth.

Information is stored by a resistance value that is dependent on a spin orientation in the free layer FL. Electrical resistance of the tunnel magneto-resistance element is turned into a high resistance state when the free layer FL is in the anti-parallel state, and turned into a low resistance state when the free layer FL is in the parallel state. In a read operation, large and small, in magnitude of the resistance of the tunnel magneto-resistance element TMR, are read out. On the other hand, in a write operation, a spin-injection magnetization reversal technology is used whereby a current is caused to vertically flow to a TMR, thereby varying the spin orientation in the free layer FL according to the direction of the current. In a memory chip, writing is executed by causing a current to flow either from a bit line BL to a source line SL, or from the source line SL to the bit line BL. Because a current necessary for writing is proportional in magnitude to a size of the tunnel magneto-resistance element TMR, miniaturization together with reduction in rewrite current can be achieved. That is, the SPRAM has an excellent characteristic in terms of scalability. These are described in detail in "2005 International Electron Device Meeting Technical Digest Papers pp. 459-462 (Non-patent Document 1), and "ISSCC 2007 Digest of Technical Papers pp. 480-481 (Nonpatent Document 2).

Further, FIG. 45 schematically shows another example of a TMR element. In the figure, a free layer is of a stacked structure unlike the case shown in FIG. 44. More specifically, the TMR element is structured such that a non-magnetic material layer MB is sandwiched between magnetic material layers that are mutually anti-parallel to each other, and these layers are integrated to serve as a free layer FL. The stacked structure may include more layers. By doing so, a memory element comprised of a TMR element whose state is stable against disturbance caused by heat can be obtained. FIG. 46 schematically shows still another example of a TMR element. In this example, unlike the case shown in FIG. 44, magnetizations in a free layer FL, and a fixed layer PL, respectively, are not oriented in the horizontal direction, but are oriented in a direction vertical to a tunnel barrier film TB. Selection of such material as described will render it possible to obtain a memory element comprised of a TMR element whose two states (parallel and anti-parallel) are stable against disturbance caused by heat. This memory element has a feature that stability in memory cell operation in a wide temperature range can be realized even after progress in scaling.

Meanwhile, multi-valued storage capable of storing a plural information in one memory cell with the use of the tunnel magneto-resistance element TMR has been under studies. In Japanese Unexamined Patent Application Publication No. 2003-78114 (Patent document 1), there is described a magnetic memory capable of realizing multi-values by connecting a plurality of TMR elements in series. Further, in Japanese Unexamined Patent Application Publication No. 2007-281334 (Patent document 2), and Japanese Unexamined Patent Application Publication No. 243933/2008 (Patent document 3), there is described a magnetic memory where plural pieces of TMR elements are arranged in parallel by use of a spin-injection magnetization-reversal element to be thereby used as a memory element of a memory cell,

CITATION LIST

Patent Literature

Patent document 1: Japanese Unexamined Patent Application Publication No. 2003-78114
Patent document 2: Japanese Unexamined Patent Application Publication No. 2007-281334
Patent document 3: Japanese Unexamined Patent Application Publication No. 2008-243933

Nonpatent Literature

Nonpatent Document 1: 2005 International Electron Device Meeting Technical Digest Papers pp. 459-462
Nonpatent Document 2: ISSCC 2007 Digest of Technical Papers pp. 480-481

SUMMARY OF INVENTION

Technical Problem

However, the memory cell in Patent Document 1 described as above is comprised of the TMR elements with a type of rewriting information by magnetic field, and a wire element for generating the magnetic field for rewriting is required for each of the plural TMR elements connected in series, so that an operation for driving the respective wire becomes complex besides an increase in the number of the steps of manufacturing. Further, the memory cell has a drawback in that as the element is more miniaturized, so the value of magnetic fields necessary for rewriting will increase. On the other hand, the memory cells, in Patent document 2, and Patent document 3, respectively, are each comprised of the plural elements connected in parallel, so that a current flowing through one of the elements undergoes a change according to a resistance ratio among the plural elements making up the memory cell, thereby rendering it difficult to control writing. Furthermore, current requirements increase to the extent of parallel connection.

With a multi-valued magnetic memory using the spin-injection magnetization-reversal element, it is necessary to solve various problems with memory operation and in high integration described as above. More specifically, there are problems with a multi-valued writing method, a multi-valued reading method, including an array operation, a method for assigning a binary data block to multi-values, a conversion method, chip configuration, mixed presence of a binary scheme and a multi-valued scheme, and a method whereby n-bits not less than two-bit are stored in one cell.

The invention has been developed under the circumstances described as above, and objects and novel features of the invention will be apparent from the following detailed description of the invention in conjunction with the accompanying drawings.

Solution to Problem

A summary of representative embodiments of the invention disclosed under the present application is briefly described as follows.

(1) Use is made of two TMR elements differing in area from each other, the two TMR elements being connected in series to each other, and 4-valued data is written thereto in two steps. In a first step, writing is executed at a current large in value, causing the TMR element larger in area to be turned into an anti-parallel state or a parallel state (resultantly, both the two TMR elements are turned into the anti-parallel state or the parallel state). By so doing, two resistance values can be created. Subsequently, in a second step, a current sufficient in value to cause the state of only the TMR element smaller in area to be reversed is caused to flow in the direction opposite to the direction of the current flowing in the first step in order to realize an additional and different resistance state. By so doing, two resistance values differing from the two resistance values created in the first step can be created. Thus, a state of four resistances is created.

(2) For a reference cell, use is made of an element having three resistance values, each thereof being equivalent to an intermediate value between the resistance values adjacent to each other in the four resistance values created as above, corresponding to two-bit information. A differential in current value between the reference cell and a memory cell is sensed to thereby read from the memory cell having the four resistance values, (3) two-bit information from outside a chip or from outside a memory region is converted into data necessary for realization of four states to be written on a latch circuit embedded in a memory cell array region to be subsequently stored therein. Writing under (1) as above is executed by use of the data.

(4) two-bit information from outside a chip or from outside a memory region is converted into data necessary for realization of four states to be written on a latch circuit embedded in a memory cell array region to be subsequently stored therein, and the data is transferred to a memory cell array, thereby executing writing under (1) as above (5) Description under (1) as above is expanded, and use is made of n-units of TMR elements differing in area from each other, the n-units of the TMR elements being connected in series to each other, thereby writing n-bits information thereto. More specifically, in a first step, writing is executed at a current capable of turning the TMR element that is the largest in area into an anti-parallel state or a parallel state. Subsequently, in a second step, writing is executed at a current capable of turning the TMR element that is the n-th largest in area into the anti-parallel state or the parallel state, the current flowing in the direction opposite to the direction of the current flowing in the first step. Then, in a third step, writing is executed at a current capable of turning the TMR element that is the (n−1)-th largest in area into the anti-parallel state or the parallel state, the current flowing in the same direction as that in the second step. In a fourth step, writing is executed at a current capable of turning the TMR element that is the (n−2)-th largest in area into the anti-parallel state or the parallel state, the current flowing in the direction opposite to, or identical to the direction of the current flowing in the third step. Orientations of the respective currents, necessary for writing, are selected. Writing is similarly executed henceforth, and in the n-th step, the TMR element that is the-th largest in area is turned into the anti-parallel state or the parallel state.

Advantageous Effects of Invention

The representative embodiments of the invention disclosed under the present application has advantageous effects in that it is possible to realize a semiconductor recording device capable of utilizing a magneto-resistance change to thereby execute multi-valued recording and reading

BRIEF DESCRIPTION OF DRAWINGS

FIG. 9 is a view showing properties of one of the TMR elements in FIG. 1 by way of example;

FIG. 10 is a view showing properties of the other of the TMR elements in FIG. 1 by way of example;

FIG. 29 is a view showing still another operation in FIG. 26 by way of example;

FIGS. 30 (a) to 30 (c) each are a view showing the properties of one of three TMR elements connected in series to each other in a semiconductor recording device according to a fourth embodiment of the invention by way of example;

FIGS. 36 (a) to 36 (c) each are a view showing the properties of one of the two TMR elements included in a semiconductor recording device according to a fifth embodiment of the invention by way of example;

FIGS. 37 (a) to 37 (c) each are a view showing the properties of the other of the two TMR elements in FIG. 36 by way of example;

DESCRIPTION OF EMBODIMENTS

Embodiments of the invention are described hereinafter with reference to the accompanying drawings. In all figures for use in describing the respective embodiments, constituent members identical to each other are, as a general rule, denoted by like reference signs, thereby omitting repeated description thereof. Further, for the embodiments, use is made of a MOSFET (Metal Oxide Semiconductor Field Effect Transistor) (abbreviated as a MOS transistor) as one example of a MISFET (Metal Insulator Semiconductor Field Effect Transistor), however, use of a non-oxide film as a gate insulating film is not excluded.

(First Embodiment)

Figure 1A:
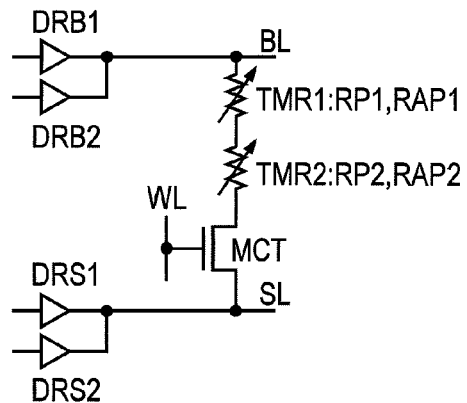
FIGS. 1 (*a*), 1 (*b*) each are a view showing an example of principal constituent elements of an principal constituent elements of a semiconductor recording device according to a first embodiment of the invention.
Figure 1B:
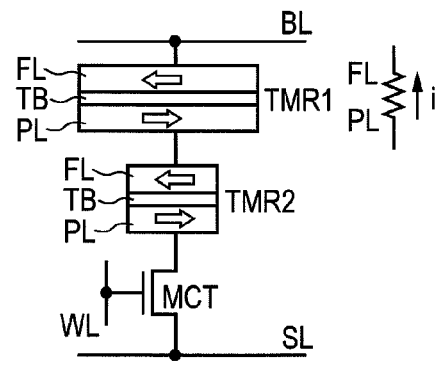

A semiconductor recording device according to a first embodiment of the invention is described hereinafter with reference to FIG. 1. FIG. 1 (a) shows principal constituent elements thereof. A selection transistor MCT controlled by a word line WL, and two TMR elements, TMR1, TMR2, connected in series thereto are disposed between a bit line BL and a source line SL. The bit line BL is driven by two write drivers DRB1, DRB2, the two write drivers differing in drive capacity from each other, and the source line SL is driven by two write drivers DRS1, DRS2, the two write drivers as well differing in drive capacity from each other. Thus, in FIG. 1, the two write drivers differing in drive capacity from each other are available for the bit line BL, and the source line SL, respectively, so that the semiconductor recording device has a feature that a current of a desired magnitude can be applied bidirectionally, that is, either from the source line SL to the bit line BL, or from the bit line BL to the source line SL, to a memory cell interposed between the bit line BL and the source line SL. In other words, the semiconductor recording device has a feature that since the bit line BL, and the source line SL each have the two write drivers differing in drive capacity from each other, at least two types of drive currents can be selected.

Now, TMR1 can have two resistance values RP1, RAP1, and TMR2 can have two resistance values RP2, RAP2. In FIG. 1 (b), there are shown a schematic sectional view of the principal part of each of the TMR elements, the bit line BL, the source line SL, and the selection transistor MCT controlled by the word line WL. The TMR element includes at least two magnetic layers, one thereof, being a fixed layer PL where a spin orientation is fixed, and the other being a free layer FL where a spin orientation assumes either of two states against the fixed layer, a parallel state, or an anti-parallel state. A tunnel barrier film TB is present between these layers. A resistance value thereof, in the parallel state, is low, and a resistance value thereof, in the anti-parallel state, is high. With TMR1, the resistance value thereof, in the parallel state, is RP1, and the resistance value thereof, in the anti-parallel state, is RAP1. With TMR2, the resistance value thereof, in the parallel state, is RP2, and the resistance value thereof, in the anti-parallel state, is RAP2.

TMR1 differs in respect of area, and so forth from TMR2, so that TMR1 differs from TMR2 in respect to a current value necessary for reversal of magnetization in the FL layer, from the parallel state to the anti-parallel state, or from the anti-parallel state to the parallel state, that is, a current value necessary for writing varies. Assuming that this current is "i", and a direction of the arrow, shown beside a resistance circuit sign depicted in the schematic sectional view of the TMR element, shown in FIG. 1 (b), is a positive direction, explanation is given hereunder. More specifically, a direction from the source line SL toward the bit line BL represents positive, and with a current flowing in this direction, a force for turning the respective TMR elements into the anti-parallel state will act on the free layer FL. The direction of a current from the bit line BL toward the source line SL becomes a negative current, and with the current in this direction, a force for turning the respective TMR elements into the parallel state will act on the free layer FL. Further, as shown in the figure, there is the case where a FL side and a PL side are expressed as FL and PL, respectively, on the left-hand side of two terminals of the resistance circuit sign. Further, TMR1 differs in respect of area, and so forth from TMR2, so that TMR1 differs in resistance value from TMR2. A resistance ratio (TMR ratio) of the resistance RP with magnetization in the parallel state to the resistance RAP with magnetization in the anti-parallel state, and a threshold current density necessary for writing can be rendered constant at TMR1, and TMR2, respectively, by properly selecting material, and a structure. In the figure, the area, of TMR1 is shown larger than that of TMR2. In this case, there is shown a structure where TMR1 is first connected to BL, and subsequently, TMR2 is connected thereto. However, sequence of connection is not limited thereto, and the sequence in which TMR1, TMR2 are connected may be reversed. As for the sequence of connection, a sequence optimal to a fabrication process can be selected. A configuration example shown in FIG. 1 has a feature that multi-valued information can be written and read by an operation method described later in the present description.

Figure 2:
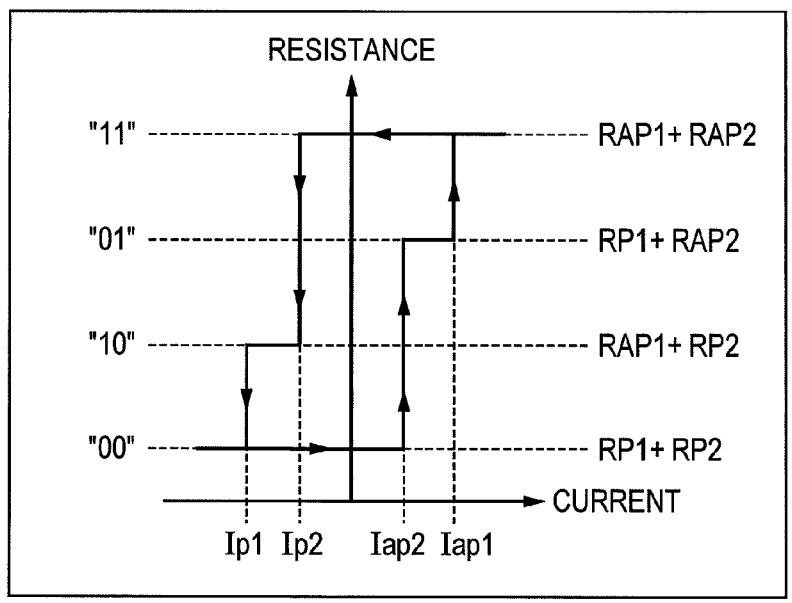
FIG. 2 is a view showing properties of TMR elements in FIG. 1 by way of example.

Respective resistance values of the two TMR elements and respective current values necessary for writing thereto can be rendered to differ in value from each other by causing, for example, the respective areas of the two TMR elements to differ from each other, as shown in FIG. 1. FIG. 2 shows an example of a relationship between specific relations of those values and 2-bit information items corresponding thereto. In FIG. 2, there is shown a relationship between respective currents flowing to the TMR elements and the respective resistance values of the two TMR elements connected in series at that point in time, that is, a hysteresis characteristic. In the figure, the hysteresis characteristic is shown by omitting current dependency of the resistance in one state (for example, both TMR1 and TMR2 are in the parallel state) as described later on. Further, since TMR1 and TMR2 are connected in series, a current of the same value flows to both TMR1 and TMR2. In FIG. 2, a current necessary for turning TMR1 into the anti-parallel state is Iap1, a current necessary for turning TMR2 into the anti-parallel state is Iap2, a current necessary for turning TMR1 into the parallel state is Ip1, a current necessary for turning TMR2 into the parallel state is Ip2, a resistance of TMR1 in the anti-parallel state is RAP1, a resistance of TMR2 in the anti-parallel state is RAP2, a resistance of TMR1 in the parallel state is RP1, and a resistance of TMR2 in the parallel state is RP2.

Herein, because the resistance ratio (TMR ratio) of the resistance RP with magnetization in the parallel state to the resistance RAP with magnetization in the anti-parallel state, and the threshold current density necessary for writing can be rendered constant at TMR1, and TMR2, respectively, the following relation holds:

$RAP1/RP1 = RAP2/RP2$ $RAP2/RAP1 = RP2/RP1$ $Iap1/Iap2 = Ip1/Ip2$

As shown in FIG. 2, four combined resistances differing from each other can be formed from the two TMR elements owing to this relation. Accordingly, two-bit information items can be stored. If the four combined resistances are arranged in increasing order of magnitude, the following inequality holds:
RP1+RP2<RAP1+RP2<RP1+RAP2<RAP1+RAP2.

Information items "00", "10", "01", and "11" are made to correspond to these resistances arranged, for example, in increasing order of magnitude, respectively. Further, since TMR1 is connected in series to TMR2, a current at the same value flows to both the resistances, however, with the resistance larger in area, a current density becomes lower. Accordingly, even if, for example, the current Iap2 necessary for turning TMR2 into the anti-parallel state is caused to flow, the current density necessary for causing TMR1 to turn into the anti-parallel state is not reached in TMR1 larger in area than TMR2. Conversely, if not less than the current Iap1 necessary for causing TMR1 large in area to be turned into the anti-parallel state is caused to flow, this current will exceeds the current density necessary for causing TMR2 as well to be turned into the anti-parallel state, as TMR2 is smaller in area than TMR1, and a current at the same value as that for TMR1 flows therethrough, so that TMR2 is also turned into the anti-parallel state. The same can be said of Ip2, and Ip1, in the current direction necessary for turning the TMR element into the parallel state.

In the hysteresis of FIG. 2, suppose the case where a current larger in value than Ip1 is first caused to flow, and both TMR1 and TMR2 are in the parallel state. In FIG. 2, Ip1 has a negative value as a current value. The respective resistances of TMR1 and TMR2 being RP1, and RP 2, the combined resistance is RP1+RP 2. The information piece "00" is assigned thereto. The current is increased from this state in the reverse direction, whereupon the current passes by 0 to be turned positive in value, that is, in the direction toward the anti-parallel state, the current value Iap2 being first reached. Upon the current slightly exceeding this value, the free layer FL of TMR2 smaller in area is reversed, whereupon the resistance value is turned from RP2 to RAP2. Then, the combined resistance is RP1+RAP2. The information piece "01" is assigned thereto. The current is further increased in this direction, and upon the current exceeding Iap1, the free layer FL of TMR1 larger in area is reversed, whereupon the resistance value is turned from RP1 to RAP1. The combined resistance is RAP1+RAP2. The information piece "11" is assigned thereto. Subsequently, upon the current being changed to flow in a reversed direction this time, the current passes by 0 to turn negative in value, that is, toward the direction for the parallel state. Upon this value reaching Ip2, and slightly exceeding Ip2, the orientation of magnetization in the free layer FL of TMR2 smaller in area is reversed. That is, TMR2 is turned into the parallel state, and the resistance is RP2. Accordingly, the combined resistance is RAP1+RP2. The information piece "10" is assigned thereto. When the current is further increased in this direction, the current reaches Ip1, and upon the current slightly exceeding this value, an operation reverts to the first stage of the hysteresis, whereupon both TMR1 and TMR2 will be in the parallel state. In this case, the combined resistance is RP1+RP 2, as described above. The information assigned thereto is the information piece "00".

The semiconductor recording device according to the first embodiment of the invention has a feature that the combined resistance is correlated with two-bit data. The principle behind this feature is that a device configuration can be expanded to a configuration in which data having bit numbers more than two-bit is written to one memory cell, as described later on. Further, as requirements of a memory cell, it need only be sufficient to have a condition under which the resistance of the memory cell essentially undergoes a change according to a current density of each of currents bidirectionally flowing, and the memory cell is not limited to a memory cell provided with a TMR element. Furthermore, a method for assigning the two-bit data to the combined resistance value as shown in FIG. 2 is available as a useful assignment method for combination of write-data, as described later on.

As is evident from the description given as above, currents of two different values, in the positive direction and the negative direction, respectively, are required at the time of the write operation. Further, a change in the respective resistances need take place according to the hysteresis shown in FIG. 2. With the present embodiment, the two write drivers differing in drive capacity from each other are, therefore, made available for the bit line BL, and the source line SL, respectively, as shown in FIG. 1. By so doing, a current flowing either from the bit line BL to the source line SL, or from the source line SL to the bit line BL, that is, the currents flowing in the positive direction, and the negative direction, respectively, can be applied to a memory cell interposed between the bit line BL and the source line SL. As to the drive current, the at least two types of drive currents can be selected. As a result, the device has a feature that desirable writing is enabled. Further, since the change in the respective resistances occurs according to this hysteresis, use is made of, for example, a writing method shown in FIG. 3.

Figure 3:
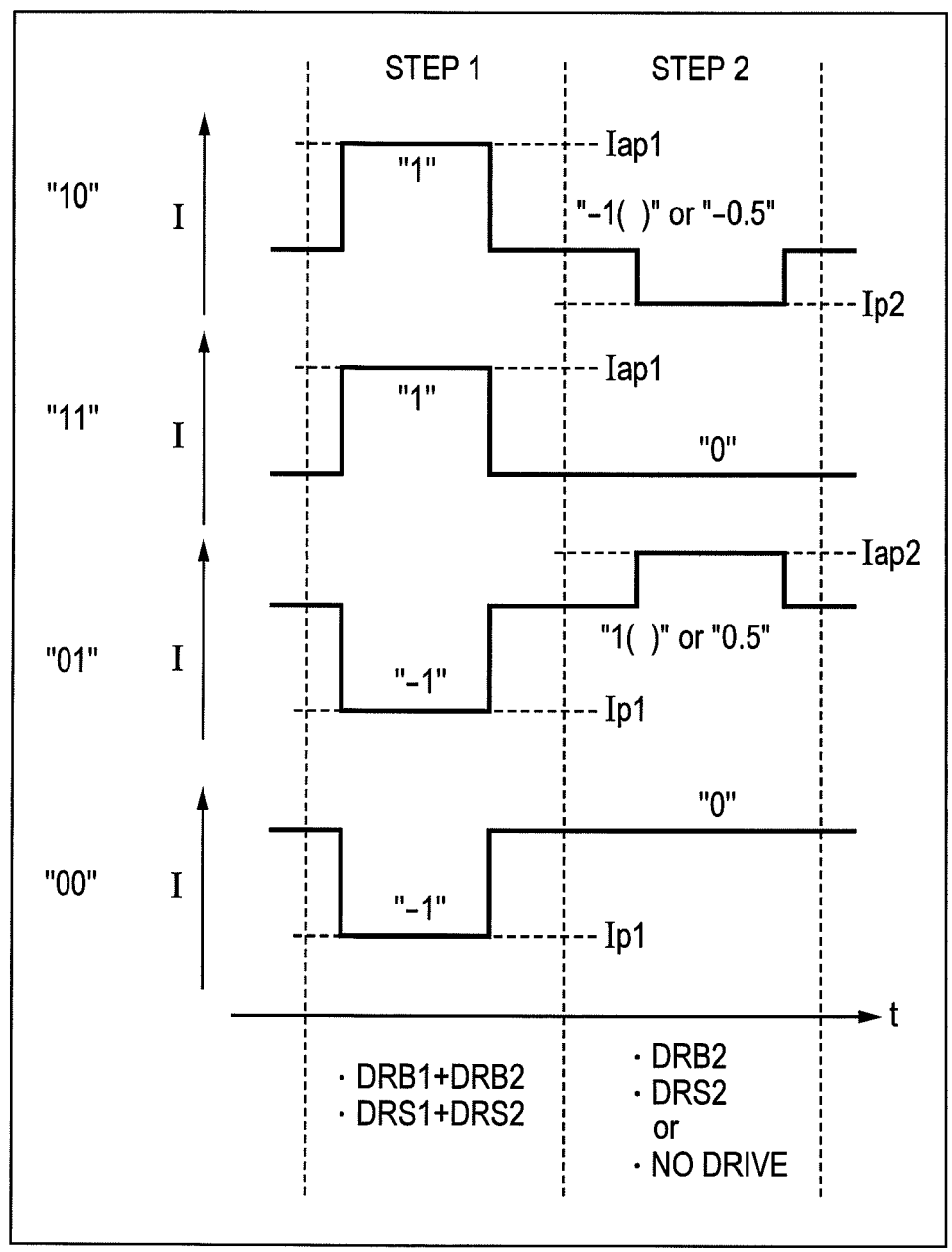
FIG. 3 is a view showing a writing operation in FIG. 1 by way of example.

FIG. 3 is a view showing an operation example according to the configuration example shown in FIG. 1. In this operation example, there is shown an example in which writing is executed in two steps by taking an advantage of the feature that writing according to the hysteresis described in FIG. 2 is realized, and the currents of at least two, or more types, flowing in the positive direction, and the negative direction, respectively, are obtained. In the figure, writings corresponding to two-bit information items, respectively, are shown in the order of "10", "11", "01", and 00", from above. First, in a step 1, states depicted at the respective ends of the hysteresis in FIG. 2 are realized. Thereafter, in a step 2, states on the inner side of the hysteresis are realized against necessary information items. It is evident from the description in FIG. 2 that the direction of a current for realization of the state on the inner side, in the step 2, is reversed from the direction of a current in the step 1. The present embodiment has a feature in that this has been found out. Further explanation is given hereinafter in sequence.

In the step 1, against the information items intended for writing, "10", "11", "01", "00", a current larger in value than Iap1 is caused to flow in the positive direction of current to "10", "11" by activating all the drivers DRB1, DRB2, DRS1, DRS2, in FIG. 1. Further, a current larger in value than Ip1 is caused to flow in the negative direction of current to "01", "00" by activating all the drivers DRB1, DRB2, DRS1, DRS2, in FIG. 1. Herein, writing whereby the current larger than Iap1 is caused to flow in the positive direction of current is expressed as "1" writing, and writing whereby the current larger than Ip1 is caused to flow in the negative direction of current is expressed as "−1" writing. This will become a concept important to build up a sequence according to the present embodiment, whereby the two-bit data is made to correspond to a current value so as to be operated as binary writing. In this case, writing in the step 1 is executed as "1" if a high order bit of the two-bit data is 1 and as "−1 if the high order bit is 0. In order to enable this, assignment of the two-bit data to the combined resistance is made in FIG. 2. This is significance of the bit assignment made as shown in FIG. 2. As a result of the writing executed in the step 1, the combined resistance is already in the state of RAP1+RAP2 for both the information items intended for writing, "10", "11". Accordingly, the writing against "11" is in a desired state, as shown in FIG. 2. Further, the combined resistance is already in the state of RP1+RP2 for both "01", and "00". Accordingly, the writing against "00" is in a desired state.

Next, the operation proceeds to a step 2. The step 2 has three features. Firstly, writing is no longer executed against a data block where a high order bit is identical to a low order bit, such as "11", and "00". Secondly, a current in the direction opposite to the direction of the current in the step 1, more specifically, a current in the direction opposite to the direction of a current for the high order bit against a data block where a high order bit differs from a low order bit, such as "10", and "01", and writing is executed by use of a small value as the value of a current this time, using a current enough to simply reverse TMR2, such as Ip2, and Iap2. In this case, the drivers DRB2, DRS2 only are used, and driving is executed by use of a current of a small value in contrast to the step 1.

Starting from above in FIG. 3, against the information piece "10", the current Ip2 in the negative direction is caused to flow, rewriting is not executed against the information piece "11", the current Iap2 in the positive direction is caused to flow against the information piece "01", and rewriting is not executed against the information piece "00". These actions are called "1 (half)" writing, or "−0.5" writing, "0" writing, "1 (half)" writing, or "0.5" writing, and "0" writing, respectively. This will become a concept important to set up such that two-bit data is made to correspond to current values to be operated for every sequence necessary for writing in the present embodiment as described later on.

Multi-valued writing is enabled by use of two-step writing whereby writing is sequentially executed by starting from the TMR element larger in write current (larger in area), as described in the foregoing. In the description given hereinabove, there has been described the case where a difference between write-current values, and a difference between resistance values after writing are realized by use of a difference in area between TMR1 and TMR2, however, even if the difference is realized by a difference in structure, or a difference in material, while an area remaining constant, or in combination with a change in area, this does not impair the essence of the present embodiment. Further, the scheme according to the present embodiment can be easily expanded even to a configuration for storing data having bit numbers more than two-bit in one memory cell, as described later on. All the TMR elements are turned into the parallel state, or the anti-parallel state, and thereafter, it need be only sufficient for the respective TMR elements to apply currents at various values necessary for turning the respective TMR into a reversed state, the value differing by the TMR element.

Figure 4:
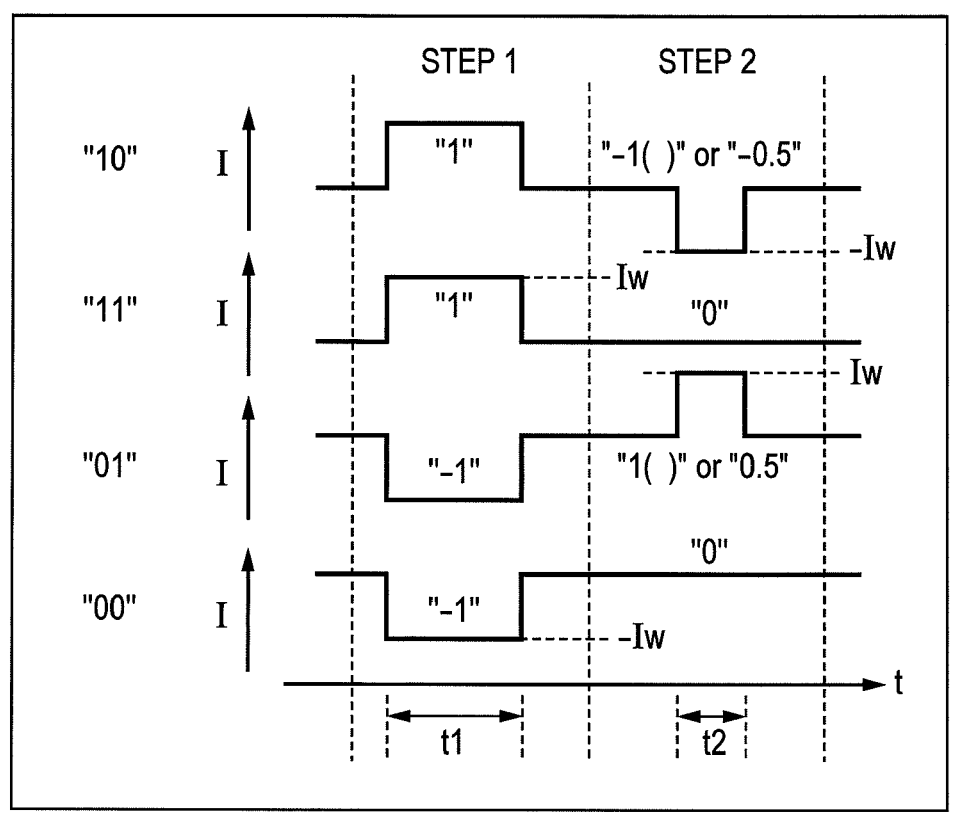
FIG. 4 is a view showing an example of a variation of the operation shown in FIG. 3.
Figure 5:
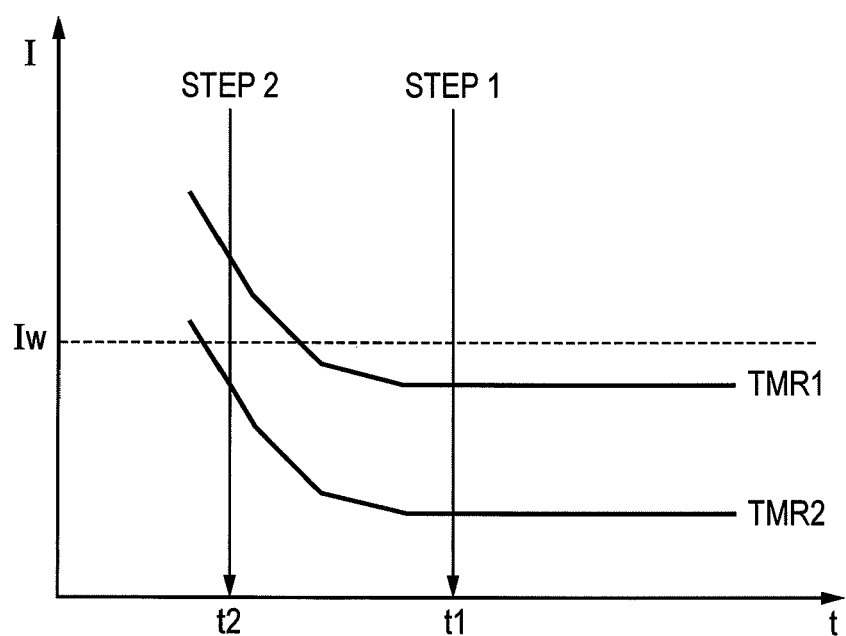
FIG. 5 is view for elaborating on FIG. 4.

FIG. 4 is a view showing an example of a variation of the operation example shown in FIG. 3, indicating that the write current of the TMR element is dependent on application time thereof, that is, by a pulse width, more specifically, using TMR element's nonlinearity between application time (s) and a current value (A), as shown in FIG. 5. In FIG. 4, the "1" writing representing writing by the current flowing in the positive direction in the step 1 is equal in current value to the "0.5" writing representing writing by the current flowing in the positive direction in the step 2, and the "−1" writing representing writing by the current flowing in the negative direction in the step 1 is equal in current value to the "−0.5" writing representing writing by the current flowing in the negative direction in the step 2. FIG. 4 differs in this respect from FIG. 3. In FIG. 4, the "1" writing differs in pulse width from the "0.5" writing, and the "1" writing has a pulse width t1 while the "0.5" writing has a pulse width t2. The same can be said of the "−1" writing, and "−0.5" writing except for difference in the current direction. Accordingly, an operation according to the hysteresis shown in FIG. 2 can be executed as is the case shown in FIG. 3. More specifically, writings of "11", and "00", respectively, are completed in a "1" writing pulse, and a "−1" writing pulse, respectively, the pulse widths thereof in the step 1 being t1. A current value in the step 2 is identical to that in the step 1 although the direction of the current is reversed, and the pulse with in the step 2 is t2 shorter than t1. Writings of "01", and "10", respectively, are executed in a "−0.5" writing pulse, and a "0.5" writing pulse, respectively.

In FIG. 4, there is shown a feature that the step 1 differs in pulse width from the step 2, as described above. The reason why this is possible is because the following property of the TMR element is found out by us. FIG. 5 is a graph concerning a current necessary for writing of the TMR element, indicating current on the vertical axis, and application time of the current, that is, a pulse width, on the horizontal axis. The direction of a current includes the positive direction, and the negative direction, however, herein, only one of the directions is shown for brevity in explanation. In the figure, two curves each indicate application time dependence of a current value necessary for writing to TMR1, TMR2, respectively. Thus, the shorter time becomes, current necessary for writing increases. In this case, assuming a current value for writing, as shown in FIG. 4, is Iw, which is indicated by a dotted line. Herein, the positive and negative currents are shown as a whole.

In FIG. 5, the pulse width in the step 1 is t1. Herein, the value Iw is in excess of the write current of TMR1, and needless to say, is in excess of the write current of TMR2 smaller than TMR1. Accordingly, both TMR 1, and TMR 2 can be reversed to a desired orientation of the magnetization (for an array to be turned into the anti-parallel state, use is made of the current in the positive direction, and for an array to be turned into the parallel state, use is made of the current in the negative direction: in the figure, the positive current, and the negative current are shown as a whole for the sake of explanation). Accordingly, the operation in the step 1 can be completed. On the other hand, as time is shorter in the pulse width t2 of the step 2, so a current necessary for writing to a TMR element increases. As a result, with TMR1 requiring a large write-current, the current necessary for writing thereto exceeds the value Iw, so that rewriting is no longer possible. However, with TMR2 whose write-current is smaller in the first place, rewriting in a desired orientation of the magnetization (for the array to be turned into the anti-parallel state, use is made of the current in the positive direction, and for the array to be turned into the parallel state, use is made of the current in the negative direction: in the figure, the positive current, and the negative current are shown as a whole for the sake of explanation) can be executed at the value Iw. Writing in the step 2 is enabled in this way.

That is, as the application time becomes shorter, so a current value necessary for rewriting of an element nonlinearly increases. Accordingly, in the case where the same current value Iw is applied, the application time t2 within which TMR2 can be rewritten but TMR1 cannot be rewritten definitely exists during application time shorter than application time t1. Therefore, even if writing is executed by use of the same current value Iw in both the step 1 and the step 2, the same writing as that shown in FIG. 3 can be realized by setting the application time at the time of writing in the step 2 to t2, as shown in FIG. 4. The operation example shown in FIG. 4 has a feature that currents in the positive direction, and negative direction, respectively, are necessary, but a smaller variety of currents will suffice. Accordingly, in contrast to the configuration shown in FIG. 1, it is unnecessary that the bit line BL, and the source line SL each are provided with plural drivers. If the bit line BL, and the source line SL each are provided with one driver, this will enable such driving as shown in FIG. 4 to be realized. Instead, an input signal of each of the drivers need include a plural input signals differing in pulse width from each other.

Figure 6A:
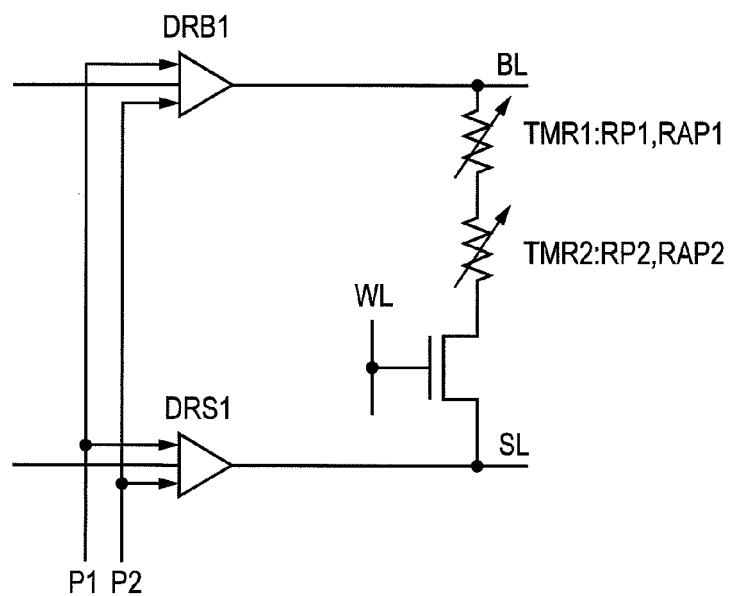
FIGS. 6 (*a*), 6 (*b*) each are a view showing respective configurations of write drivers, differing from each other, and corresponding to respective operation examples in FIG. 4 by way of example.
Figure 6B:
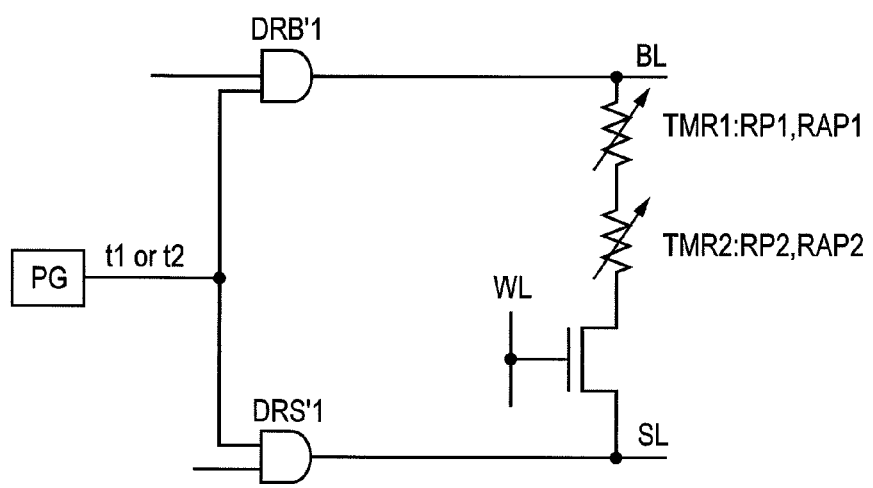

FIG. 6 shows a configuration example of the write driver in the case of using a write scheme shown in FIG. 4. FIGS. 6 (a), 6 (b) each are a schematic view showing configuration examples differing from each other. In FIG. 6 (a), the driver provided at a bit line BL is only DRB1, and the driver provided at a source line SL is only DRS1. Input signals P1, P2, for specifying timing, are inputted to DRB1 and DRS1, respectively. The respective drivers are driven by the agency of P1 for the duration of t1 of FIG. 5, and the respective drivers are driven by the agency of P2 for the duration of t2. In the case of this configuration example, the current of a desired magnitude can be bidirectionally applied, either from the source line SL to the bit line BL, or from the bit line BL to the source line SL, to a memory cell interposed between the bit line BL and the source line SL by the agency of timing signals t1, t2, respectively, while varying application time of the current. Accordingly, this configuration example has a feature that the multi-valued writing can be executed by utilizing a property shown in FIG. 5.

In FIG. 6 (b), a bit line BL, and a source line SL are provided with one write driver DRB'1, and one write driver DRS'1, respectively. DRB'1, and DRS'1 are each operated by AND circuits, write data items at a value complementary to DRB'1, and DRS'1, respectively, are each inputted to one of two inputs of each of the drivers, and a common 'H' level pulse signal with a pulse width t1, or t2, outputted from a pulse generation circuit PG, is inputted to the other of the two inputs. By so doing, one of DRB'1 and DRS'1 can supply a current to the other for the duration of the 'H' level pulse. Further, in this case, the AND circuit is used; however, a configuration can be changed as appropriate in such a way as to use, for example, a NAND circuit to thereby cause one of DRB'1, and DRS'1 to draw the current from the other.

Figure 7:
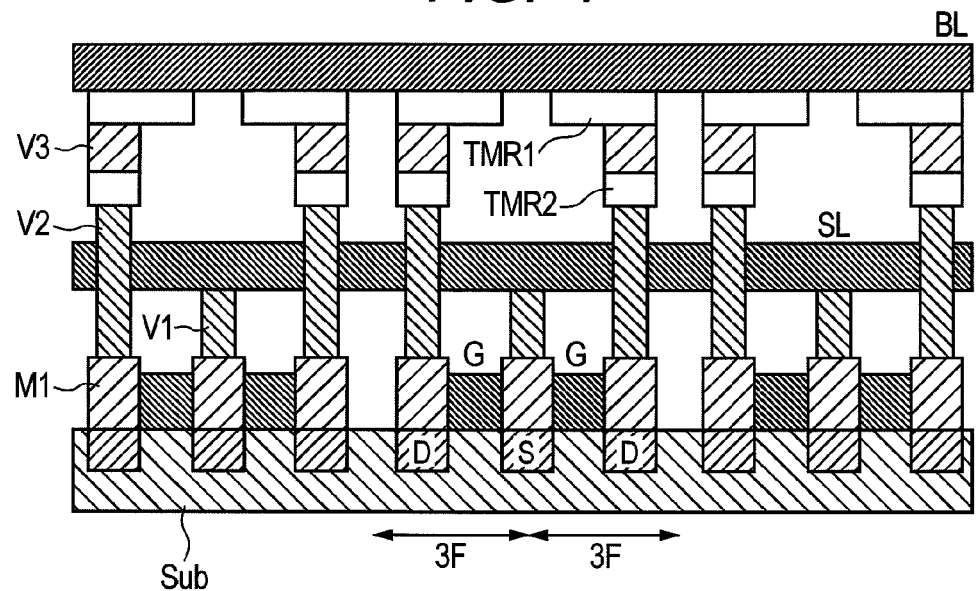
FIG. 7 is a sectional view showing a part of a structure shown in FIG. 1 by way of example.

FIG. 7 is a sectional view showing an example of the structure of a memory cell used in the semiconductor recording device according to the first embodiment. A MOS transistor (a source region S, a drain region D, a gate electrode region G) is formed on a semiconductor substrate Sub. With the MOS transistor, two transistors share the source region S, and the source region S is connected to a source line SL through the intermediary of M1, V1, as a metal interconnection region, and a metal connection region, respectively. The drain region D is connected to a TMR element TMR2 through the intermediary of M1, V2, serving as the metal interconnection region, and the metal connection region, respectively. In the figure, the TMR elements (TMR1, TMR2) each include not only the basic structures shown FIGS. 44 to 46, respectively, but also metal regions incorporating these structures. The TMR2 is connected in series to the next TMR1 through the intermediary of a metal connection region V3. The TMR1 is connected to a bit line BL. The TMR1 includes not only the basic structures shown in FIGS. 44 to 46, respectively, but also the metal regions incorporating these structures.

In the sectional view, as for respective lengths of the TMR1, and the TMR2, in the horizontal direction thereof, the length of the TMR1 is, for example, twice as long as F (expressed as 2F) assuming that a minimum fabrication size thereof is F, and the length of the TMR2 is F. Further, assuming that respective lengths of the TMR1, and the TMR2, in the direction vertical to the plane of the figure, are identical to each other, and that each of the lengths is for example, F, the TMR1 has an area 2F×F, and the TMR2 has an area equivalent to half the area of the TMR1, that is, F×F. Accordingly, on the assumption that TMR1, and TMR2 are identical to each other in respect of other structures, sheet resistance, a current density necessary for writing, and the ratio of the resistance for the parallel state to the resistance for the anti-parallel state, a current twice as large in value as that for TMR2 is required in order to reverse the magnetization of the TMR1. In this case, if sizes of respective insulating regions in the horizontal direction among the source region, the drain region, the gate region, and the source region is F, a size of one cell in the horizontal direction thereof is 3F. As an insulation region of F, and an interconnection region of F are required in the direction vertical to the plane of the figure, an area of one cell becomes 6F (3F×2F) squared in size.

If the sectional structure shown in FIG. 7 is adopted, the memory cell necessary for the present embodiment of the invention can be realized in this area. Since two-bit information items can be stored against the size of 6F squared, the size of one cell becomes 3F squared per bit. Further, with the TMR1, and the TMR2, respectively, the TMR1 is disposed on a side of the metal connection region V3, adjacent to the bit line BL, in the figure, and the TMR2 is disposed between the TMR1 and the drain region, however, such a displacement of the TMR elements may be reversed. Further, as for the fixed layer, and the free layer, there is the case where the fixed layer is placed on the substrate Sub side of the cell or the case where the fixed layer is placed on a side of the cell, opposite therefrom, as described later on. Even if the free layer is made up of a vertical magnetizations film shown in FIG. 46, it is possible to adopt a structure where the fixed layer is placed on the Sub side of the cell. Further, in the TMR1 and the TMR2, respectively, the sequence of the fixed layer and the free layer may be changed. The MOS transistor can be either an NMOS transistor or a PMOS transistor.

Figure 8A:
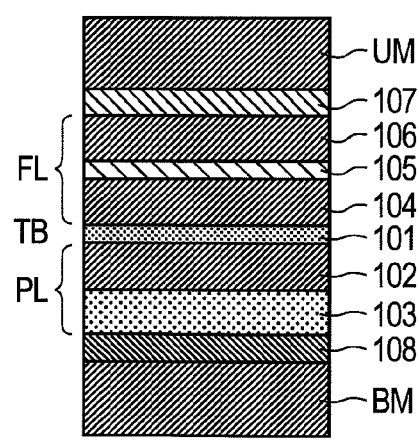
FIGS. 8 (*a*) to 8 (*c*) each show a detailed structure of a TMR element in FIG. 7 by way of example.
Figure 8B:
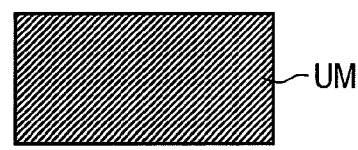
Figure 8C:
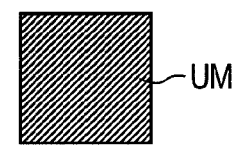
Figure 44A:
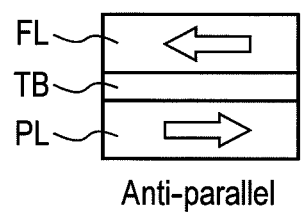
FIG. 44 (a), FIG. 44 (b) each are a view showing an example of a tunneling magneto-resistance element.
Figure 44B:
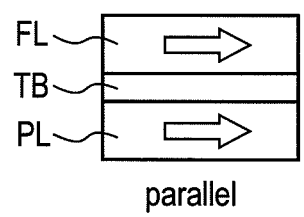
Figure 45A:
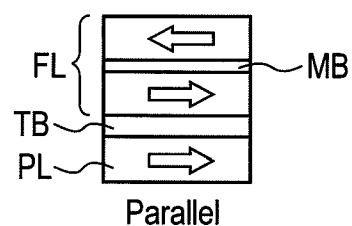
FIG. 45 (a), FIG. 45 (b) each are a view showing an example of another tunneling magneto-resistance element.
Figure 45B:
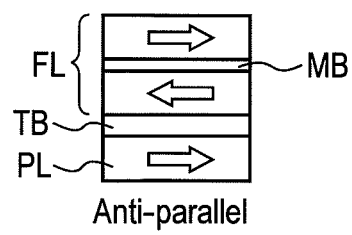
Figure 46A:
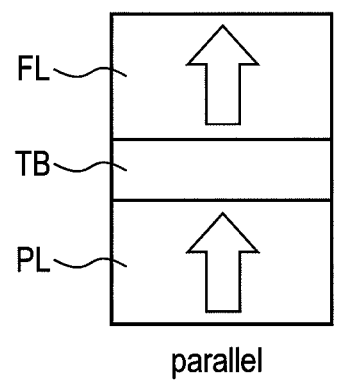
FIG. 46 (a), FIG. 46 (b) each are a view showing an example of still another tunneling magneto-resistance element.
Figure 46B:
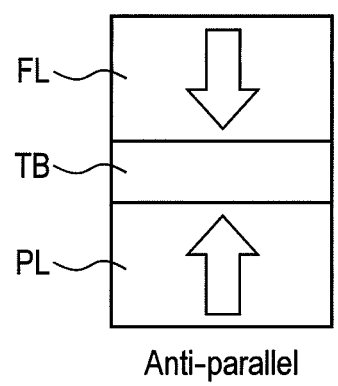

While the TMR1 element and the TMR2 element shown in FIG. 7 each have the structure including not only the basic structures shown FIGS. 44 to 46, respectively, but also the metal regions incorporating these structures, FIG. 8 (a) shows an example in which this structure is described in greater detail. In the figure, a basic structure corresponds to that in FIG. 45. Metal layers BM and UM each are a part of the TMR1 element connected to the bit line or the transistor through the intermediary of other metal connection regions. First, a metal layer 108 is placed on the metal layer BM. The metal layer BM and the metal layer 108 are integrated into one layer from time to time. A fixed layer PL is disposed thereon, and the fixed layer PL in the figure is of a bilayer structure made up of layers 103 and 102. The layer 103 is an antiferromagnetic film, and the layer 102 is a ferromagnetic film. An orientation of magnetization initially decided is strongly fixed by joining the antiferromagnetic film 103 with the ferromagnetic film 102 in this way. As a result, there is formed the fixed layer PL where magnetization does not undergo a change by the agency of a write current, and so forth. A tunnel barrier film TB is placed thereon. A free layer FL is placed thereon. The tunnel barrier film TB is an insulating film made of MgO, and so forth. In the case of this example, the free layer FL is of a multi-layered structure made up of layers 104, 105, 106. The layers 104, 106 each are a ferromagnetic film, however, the layer 105 is a metal layer made of Ru (ruthenium) and so forth. Further, the respective magnetizations of the layers 104, 106 are rendered anti-parallel to each other.

Herein, there is adopted a structure where the metal layer is sandwiched between the two ferromagnetic material films 104, 106, however, the number of the ferromagnetic material films may be increased to enable use of a structure where four ferromagnetic material films are used, and a metal layer is inserted between the respective two ferromagnetic material films (in this case, three layers in total are necessary on each side). Use may be made of a multi-layered structure having more layers. By so doing, it is possible to enhance resistance to fluctuation in the orientation of magnetization in the free layer FL, due to disturbance caused by heat. In general, as temperature rises, so the orientation of the magnetization of the free layer FL becomes susceptible to fluctuation, thereby causing an increase in the probability that the magnetization is turned to an orientation opposite to the orientation as written. However, with the use of the multi-layered structure described as above, the probability of the magnetization being turned to the orientation opposite to the orientation as written can be controlled to a low level posing no problem from the practical point of view. Further, a threshold of a current for writing can be controlled low. An upper part of the free layer FL is connected to the metal layer UM through the intermediary of a metal layer 107. The metal layer UM, and the metal layer 107 are integrated into one layer at times. The TMR element having the described sectional structure as seen from above is shown in Fig. (b) and Fig. (c), respectively. The horizontal direction in these figures corresponds to the horizontal direction in FIG. 7. An orientation in the direction vertical to the plane of FIG. 7 corresponds to the vertical direction in these figures. Fig. (b) is a schematic view of TMR1 that is 2F in horizontal size, and F in vertical size, as seen from the metal layer UM side of the structure, and Fig. (c) is a schematic view of TMR2 that is F in horizontal size, and F in vertical size, as seen from the metal layer UM side of the structure. TMR1 and TMR2 each have the sectional structure shown in FIG. 8 (a).

It has thus far been described that with the respective TMR films in the case of the free layer FL being in the parallel state, and in the anti-parallel state, respectively, against the fixed layer, eve if a value of the current flowing in either of the states is changed, the resistance value remains constant. By so doing, it has been possible to describe the essential feature of the semiconductor recording device according to the present embodiment. In reality, however, the resistance value undergoes a change in response to a current flowing in each of the states, and therefore, there is described hereinafter the behavior of the memory element, including the change as described. First, the behavior of each of the two TMR elements (TMR1, TMR2) is shown with reference to FIGS. 9, 10, respectively, and subsequently, the behavior thereof in the case where the TMR elements are connected in series to each other is shown with reference to FIG. 11

FIG. 9 (a) is view showing a hysteresis identical in type to the hysteresis used in the description given thus far. The hysteresis represents the characteristic of TMR2 that an area is small, and a current necessary for writing is small in value, but a resistance is large. Assuming that the direction of a current value "i" flowing from the fixed layer toward the free layer is a positive direction {a circuit sign shown in FIG. 9 (c)}, FIG. 9 (a) shows a relationship between the resistance R of TMR2 and the current value "i" of the current that is flowing. If a positive current exceeds a current necessary for writing to TMR2, TMR2 is turned into the anti-parallel state, and the resistance value thereof will be turned to RAP2, and if a negative current exceeds the current necessary for writing to TMR2, TMR2 is turned into the parallel state, and the resistance value thereof will be turned to RP2. At this point in time, the relationship between the actual resistance R and the current value "I" is as shown in FIG. 9 (b). In the parallel state, even if the current is changed in this state, a change in the resistance RP2 is small. However, in the anti-parallel state, there is shown a characteristic that if the current is changed in this state, the resistance RAP2 decreases in the positive direction as well as the negative direction. There is a need for calling attention to this characteristic in the case of designing, and forming a reference current cell at the time of reading, as described later on, and at the time of setting a current value (because there can be the case of the current value being affected by the resistance value) when a current is caused to flow at writing Similarly, FIG. 10 shows the characteristic of TMR1 that is large in area, and a current necessary for writing is large, but a resistance is small. FIG. 10 (a) is view showing a hysteresis identical in type to the hysteresis used in the description given thus far. Assuming that the direction of a current, indicated by a circuit sign shown in FIG. 10 (c), is a positive direction, if a positive current exceeds the current necessary for writing to TMR1, TMR1 will be turned into the anti-parallel state, and the resistance value thereof will be RAP1, and if a negative current exceeds the current necessary for writing of TMR1, TMR1 is turned into the parallel state, and the resistance value thereof will be RP1. At this point in time, the relationship between the actual resistance R and the current value "i" is as shown in FIG. 10 (b). In the anti-parallel state, there is shown a characteristic that if the current is changed in this state, the resistance RAP1 decreases in the positive direction as well as the negative direction.

Figures 11A, 11B, 11C:
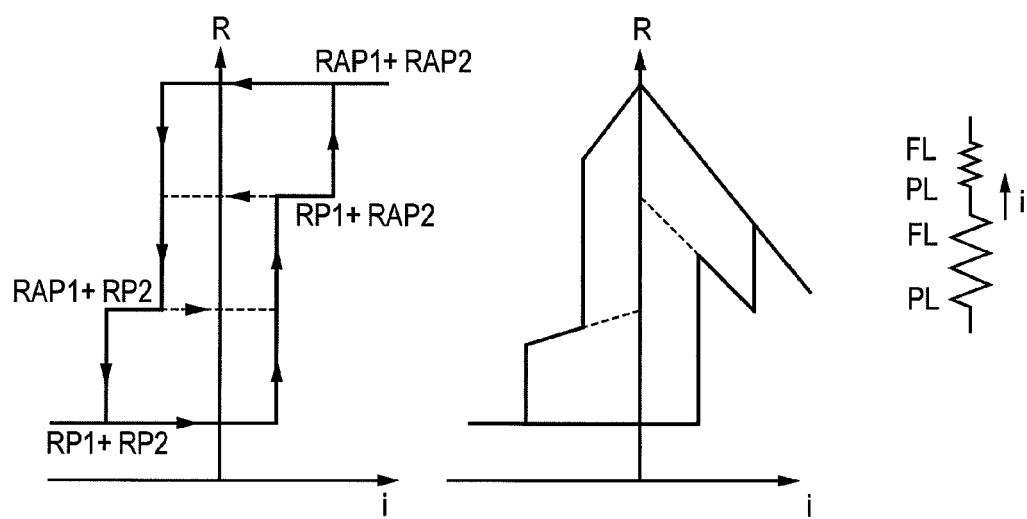
FIG. 11 is a view showing a property example of the TMR elements shown in FIGS. 9, 10, respectively, being connected in series to each other.

In FIG. 11, there is shown a characteristic of the two TMR elements connected in series to each other. If the direction of a current, indicated by a circuit sign shown in FIG. 11 (c), is a positive direction, there has thus far been given explanation stating that the characteristic of those TMR elements is similar to the characteristic shown in FIG. 2. In reality, however, with the respective TMR elements in the anti-parallel state, if the current is changed in this state, the resistance decreases in the positive direction as well as the negative direction, exhibiting therefore a characteristic shown in FIG. 11 (b). The present embodiment incorporates a feature that writing and reading are executed by taking the characteristic shown in FIG. 11 (b) into consideration. More specifically, the characteristic of the reference current cell at the time of reading is caused to match current dependence of the resistance in the anti-parallel state. That is, if a current is caused to undergo a change changed, the resistance in the anti-parallel state will decrease in the positive direction as well as the negative direction. A reference current cell having dependence following this characteristic is set up. For example, a cell in the parallel state, and a cell in the anti-parallel state are prepared to be connected in parallel with each other, thereby making up a circuit configuration capable of setting a load current to an adequate value, or simulating current dependence of the anti-parallel state. Further, at the time of rewriting from the anti-parallel state to the parallel state, the resistance is already lower at the point of actual rewriting. Accordingly, rewrite is enabled by use of a smaller application voltage. More specifically, the TMR ratio at the time of actual rewriting is smaller than the TMR ratio at the time of reading at a small current, so that an actual TMR ratio is on a safer side so as to enable rewriting with greater ease, which is advantageous form the standpoint of designing. Further, a current that is caused to flow at the time of reading can be a further smaller current against the element smaller in area, where a current necessary for rewriting at the time of rewriting, shown in FIGS. 1, 2, and so forth, is small. As a result, effects of disturbance on other elements at the time of reading from this element can be reduced, so that the circuit configuration described is advantageous in respect of reading as well from a designing point of view.

Next, there is described hereinafter a control method for controlling supply of write data to a memory cell at the time of two-bit writing for creating a state of 4-valued resistances in the memory cell. This control method is executed by a write conversion circuit, as described later on, in accordance with a write action, using a latch circuit placed inside an unselect sense amp, outside an array, or a sense latch circuit of an array where writing is not carried out, and so forth. More specifically, the write conversion circuit converts original data into signals "0", "1", "−1", "0.5", or "−0.5", corresponding to data items necessary for sequential execution of writing, while using these latch circuits, and so forth, thereby creating the state of the 4-valued resistances in one memory cell, and enabling two-bit writing.

Figure 12:
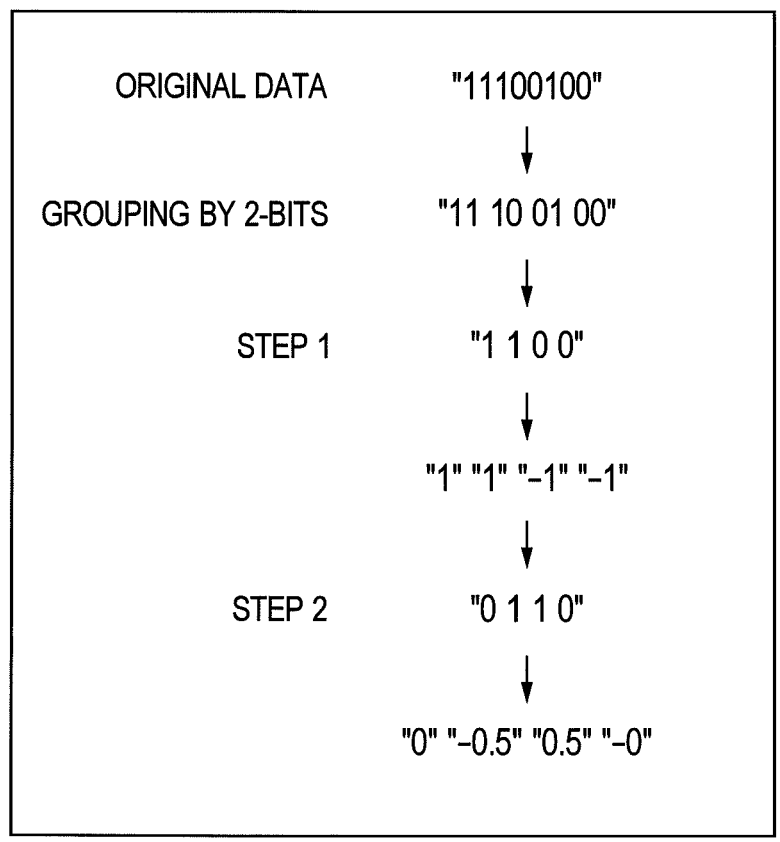
FIG. 12 is a view showing a procedure for data conversion accompanying the writing operation in FIG. 1.

Herein, first, an original data row is assumed "11100100", as shown in FIG. 12. The original data row is grouped by two-bit, thereby obtaining "11", "10", "01", "00". The memory cell is rewritten by use of the two-bit data such that the state of the 4-valued resistances is created in two steps. For this purpose, in this grouping, a data block whose high order bit is 1, as the data block for the step 1, is formed as a data block "1", and a data block whose high order bit is 0 is formed as a data block "0". Accordingly, alignment sequence becomes 1, 1, 0, 0. However, because of a need for also considering the direction of a current, as previously described, the alignment sequence becomes "1", "1", "−1", "−1", as notation incorporating the need described as above. Thus, there is obtained data necessary in the step 1 by taking the direction of a current into consideration. Next, in the step 2, if a high order bit differs from a low order bit, a data block "1" is formed, and if the high order bit is identical to the low order bit, a data block "0" is formed. With the data block at "0", rewriting is no longer executed in the step 2. More specifically, no current is caused to flow. On the other hand, with the data block at. "1", rewriting is executed even in the step 2, but the direction of the current is changed from the direction of the current in the step 1, which represents the feature of the present embodiment, and if the step is "1", the step 2 is expressed by sign "−0.5", while if the step is "−1", the step 2 is expressed by sign "0.5". More specifically, differentiation between "1" and "0.5" is effected such that the number of the drivers that are driven is, for example, two in the case of "1", and the number of the drivers that are driven is, for example, one in the case of "0.5". It need only be sufficient to use a logic circuit capable of driving in such a way as above. Needless to say, a − sign, and a sign (+ sign) without any mark attached thereto define the direction of a current, from the bit line toward the source line, and from the source line toward the bit line, respectively.

Figure 13A:
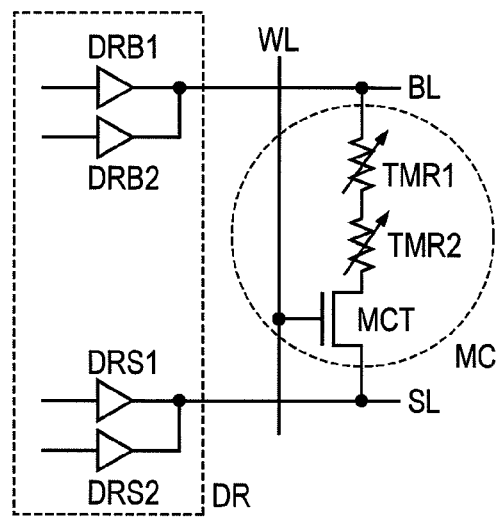
FIGS. 13 (a), 13 (b) each are a view showing notation for a memory cell used in the present embodiment.
Figure 13B:
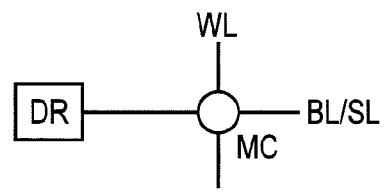

FIG. 13 is a view for indicating the feature of the semiconductor recording device according to the first embodiment, and explaining about a notation method in description given hereunder. FIG. 13 (a) is similar to FIG. 1 (a), and a memory cell including a selection transistor MCT controlled by a word line WL connected in series to two TMR elements (TMR1 and TMR2) is denoted by MC. Further, two write drivers DRB1, DRB2, differing in drive capacity from each other, for driving a bit line BL, and two write drivers DRS1, DRS2, differing in drive capacity from each other, for driving a source line SL are together denoted by write driver DR. Further, the bit line BL, and source line SL are integrated into one length to be denoted by one length of BL/SL, and notation shown in FIG. 13 (b) is adopted. MC is depicted as a circle at an intersection between the word line WL and BL/SL, representing the contents of MC in FIG. 13 (a).

Figure 14:
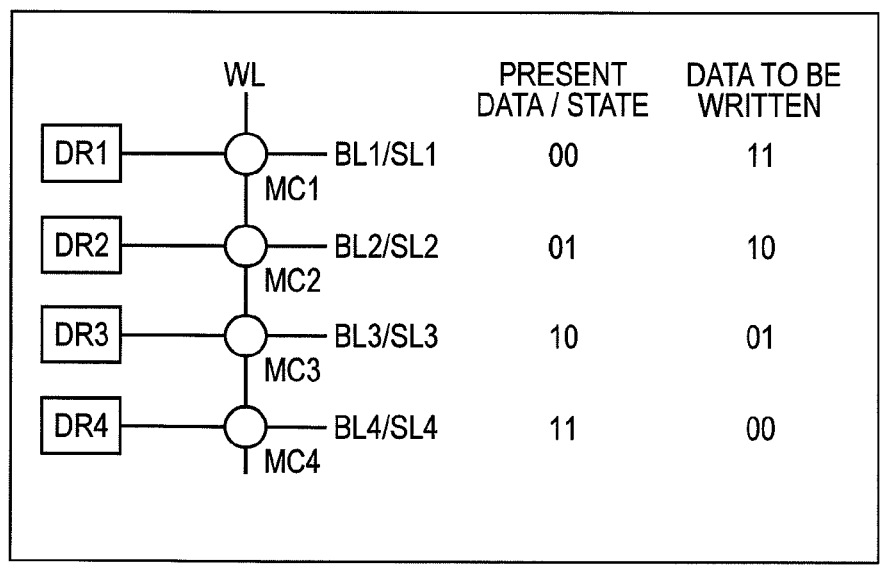
FIG. 14 is view for elaborating on FIG. 12, showing a plurality of memory cells prior to writing and respective storage states thereof by way of example.

Now, suppose the case where two-bit data "11", "10", "01", "00" are written to each of four memory cells MC1, MC2, MC3, MC4, connected to one length of the word line WL, as shown in FIG. 14. There are disposed write drivers DR1, DR2, DR3, DR4, corresponding to the memory cells, respectively. The two-bit data items "11", "10", "01", and "00" are obtained by partitioning a 1-bit data row "11100100" by two data items, as described in the foregoing. Normally eight memory cell are required to write eight data items thereto, however, if the 1-bit data row "11100100" is partitioned by two data items to obtain the two-bit data "11", "10", "01", "00", as described in the foregoing, and the two data items thereof are written to one memory cell, only four memory are required, so that the capacity of a memory can be doubled without increasing the number of memory cells. Further, in this case, assuming that respective states of resistances realizing the data items of the present cell prior to writing have been "00", "01", "10", "11" with respect to each of the memory cells MC1, MC2, MC3, and MC4.

Figure 15:
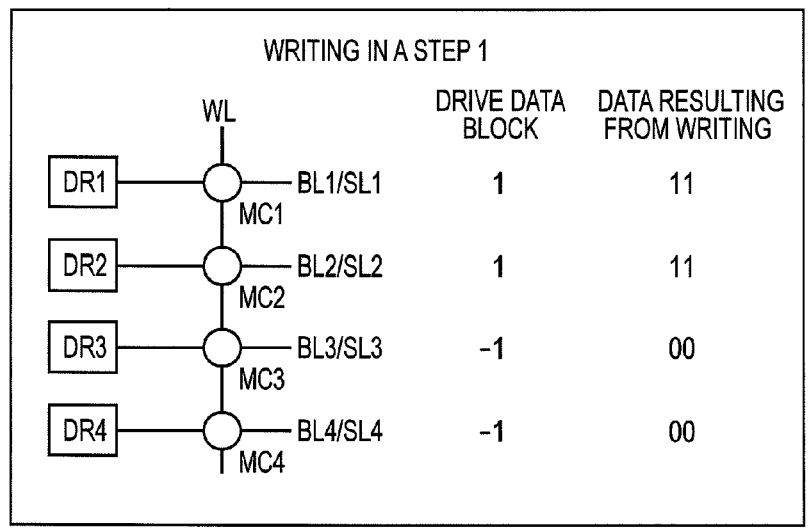
FIG. 15 is a view showing a way in which drive data items are given to the plural memory cells, respectively, in a step 1, subsequent to FIG. 14.

Next, the operation is shifted to the step 1. Upon a write data row being converted as shown in FIG. 12, the data items "1", "1", "−1", "−1" are set to the write drivers DR1, DR2, DR3, DR4, respectively, as shown in FIG. 15. The − sign, and the sign (+ sign) without any mark attached thereto each indicate the direction of a current, and numerals 0.5 and 1 each indicate magnitude of current values 0.5 and 1, respectively, 0.5 meaning a value smaller than 1. When a memory cell corresponding to a write driver is driven by the write driver under this condition, the operation follows the hysteresis described with reference to FIG. 2, so that both the two TMR elements in the memory cell will be either in the antiparallel state, or in the parallel state. Writing results in two-bit data "11", "11", "00", "00".

Figure 16:
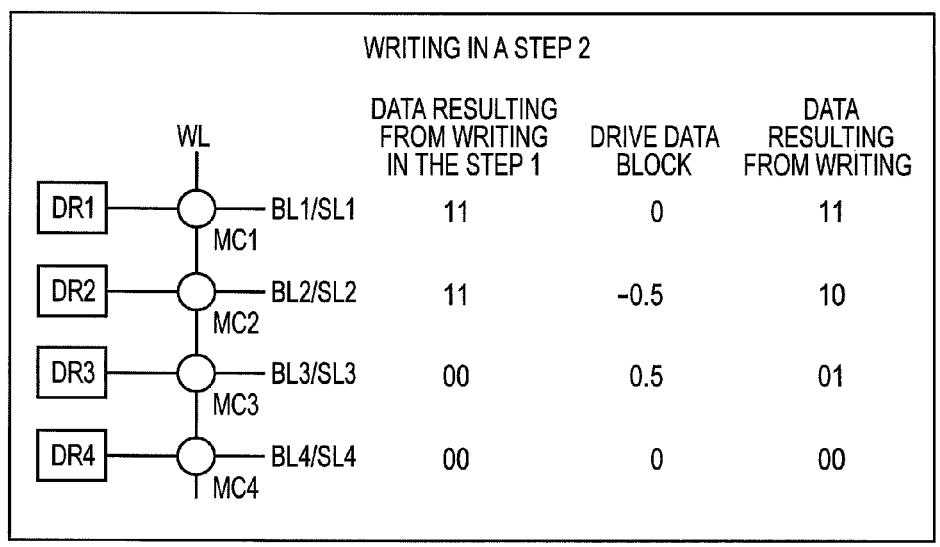
FIG. 16 is a view showing a way in which drive data items are given to the plural memory cells, respectively, in a step 2, subsequent to FIG. 15.

Next, the operation is shifted to the step 2. In this case, upon the write data row being converted as shown in FIG. 12, the data items "0", "−0.5", "0.5", "0" are set to the write drivers DR1, DR2, DR3, DR4, respectively, as shown in FIG. 16. The − sign, and the sign (+ sign) without any mark attached thereto each indicate the direction of a current, and "0.5" indicates magnitude of a current value while "0" indicates no application of a current. When a memory cell corresponding to a write driver, is driven by the write driver, the operation follows the hysteresis described with reference to FIG. 2, whereupon MC2 and MC3 only undergo a change in resistance value. By so doing, data due to writing results in two-bit data "11", "10", "01", "00".

Thus, with the present embodiment, it becomes possible to concurrently write desired information items differing from each other to the respective memory cells with respect to a plurality of the memory cells MC1, MC2, MC3, and MC4 connected to the one length of the word line WL, as described in the foregoing with reference to FIGS. 13 to 16.

Figures 17, 18:
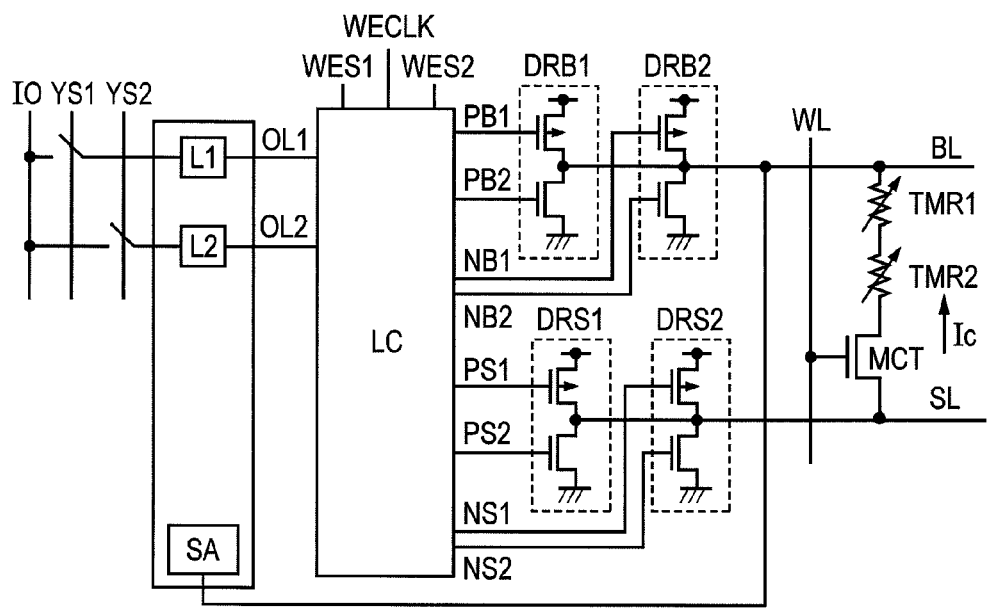
FIG. 17 is a view showing a detailed configuration of a block for use in execution of writing in FIG. 1 by way of example.
FIG. 18 is a view showing a relation between an input and an output in a control logic circuit of FIG. 17 by way of example.

Next, FIG. 17 shows a specific configuration example of a control circuit for realizing the operation described as above in the semiconductor recording device according to the first embodiment. In FIG. 17, a memory cell is disposed between a bit line BL and a source line SL, and the memory cell is made up of two TMR elements TMR1, TMR2, connected in series to each other, and a selection transistor MCT controlled by a word line WL. The bit line BL is controlled by write drivers DRB1, DRB2. If DRB1, DRB2 are concurrently selected, a large current can be supplied, and if only either one of DRB1, and DRB2 is selected, a small current is supplied. The write drivers each are made up of a PMOS transistor and an NMOS transistor. For example, DRB1 is made up of a PMOS transistor controlled by PB1, and an NMOS transistor controlled by PB2. DRB2 is identical in configuration to DRB1, and is controlled by NB1, NB2, respectively.

The source line SL is controlled by write drivers DRS1, DRS2. The respective write drivers are identical in configuration to DRB1, and DRS1 is controlled by PS1, and PS2, respectively, while DRS2 is controlled by NS1, NS2, respectively. A block for supplying a control signal to these write drivers, respectively, is a control logic circuit LC. LC has a function for selecting the write driver on the basis of respective signals OL1, OL2, a function for identifying the step 1 or the step 2 on the basis of WES1, and WES2, and a function for deciding operation timing by use of WECLK. OL1 and OL2 are respective outputs of a latch circuit L1 and a latch circuit L2, herein, the latch circuit L1 storing the high order bit, while the latch circuit L2 storing the low order bit, at the time of partitioning a data row from outside by two-bit. In this case, there is shown an example where the data row is supplied by two-bit from an input/output line IO to OL1, OL2, respectively, via control by Y-system select signals YS1, and YS2, respectively. Further, a sense amplifier SA for use at the time of reading is connected to the bit line BL.

Figure 19:
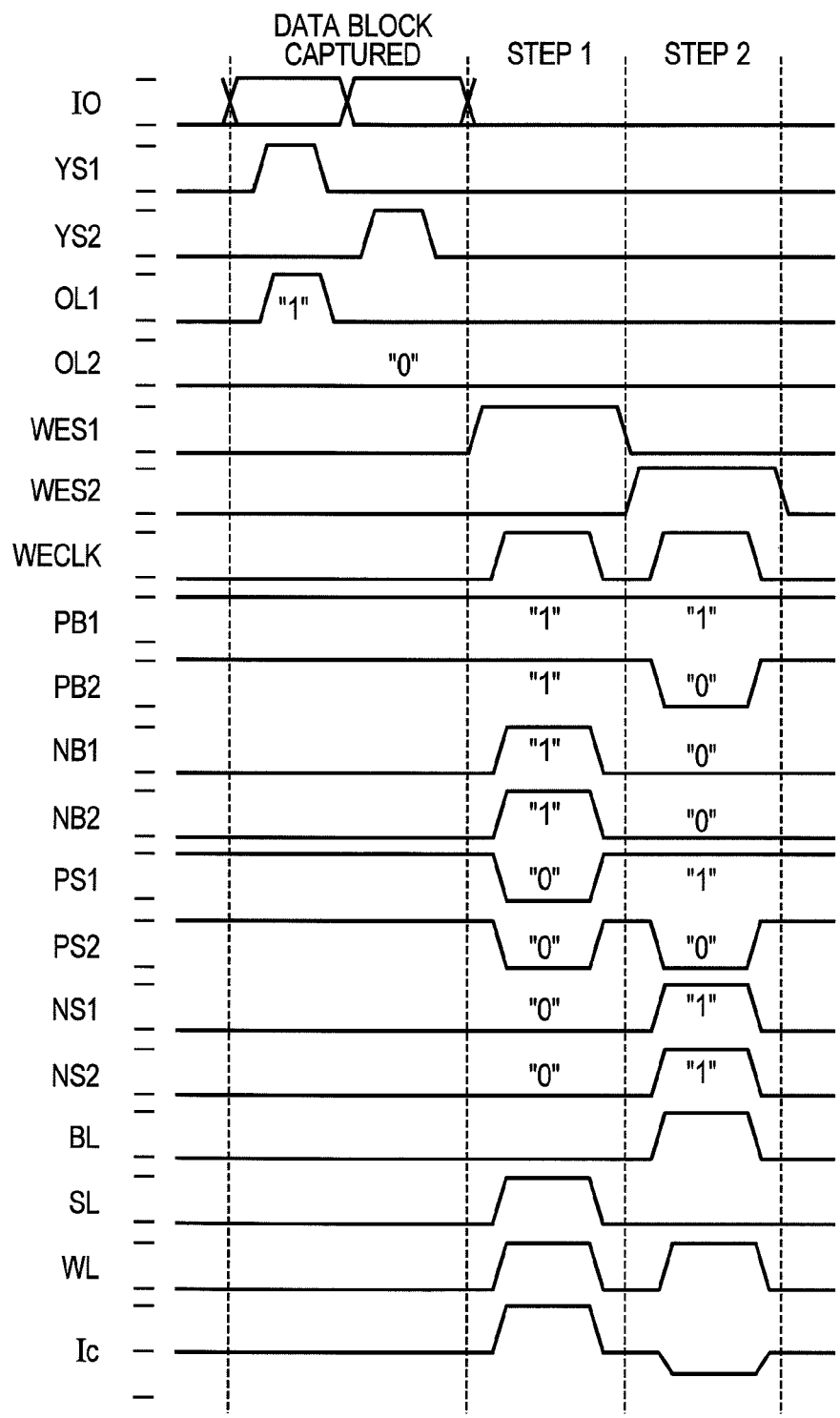
FIG. 19 is a view showing an operation in FIG. 17 by way of example.

In FIG. 18, there is shown a truth table where there are listed OL1, and OL2, as two-bit data to be written as the function of LC, and WES1, and WES2 for identifying the step 1 or the step 2 as inputs, and PB1 to NS2, as select signals of the respective write drivers, as outputs from the inputs. A write driver is selected according to this output, and drive timing thereof is decided by WECLK. FIG. 19 shows an operation using the LC, as shown in FIG. 17. First, a data block to be written out of a bit row is captured by the latch circuit L1, and the latch circuit L2, respectively. If YS1 is selected while the input/output line IO is changed over according to a clock (not shown), or a select signal of a chip or a memory block, the data block is captured by L1. The data block is assumed to be "1". The next data block of the bit row is in sync with the same clock and so forth, and is captured by the latch circuit L2 by the agency of YS2. This data block is assumed to be "0". More specifically, "10" in two-bit data is captured out of the bit row.

Referring back to FIG. 2, the two TMR elements should be first turned into the anti-parallel state (the step 1), and subsequently, the TMR2 element should be turned into the parallel state by use of a weak current flowing in the reversed direction (the step 2) in order to execute writing. As is evident from FIG. 18, the respective outputs of LC in the step 1, that is, the respective inputs of DRB1, DRB2 are all at 1, namely, at High level, so that the respective NMOS transistors of both DRB1 and DRB2 are turned ON. Concurrently, the respective inputs of DRS1 and DRS2 are all at 0, namely, at Low level, so that the respective PMOS transistors of both DRS1 and DRS2 are turned ON. It is clear from this that if the word line is selected, a large current by the two drivers flows to a memory cell connected to the word line from the source line to the bit line in a direction toward the anti-parallel state. That is, a desired operation is realized. It is also apparent from the table of FIG. 18 that only the PMOS transistor of DRB2, and the NMOS transistor of DRS2 are turned ON in the step 2, so that if the word line is selected, a small current by one driver flows this time to a memory cell connected to the word line from the bit line to the source line in the direction opposite to the direction in the step 1, toward the parallel state.

Referring to FIG. 19, the respective data items of OL1 and OL2 are captured and subsequently, WES1 is selected. By so doing, writing in the step 1 starts. Subsequent to the election of WES1, outputting from LC, according to the table of FIG. 18, is enabled, and LC supplies the select signals PB1 to NS2 to the write drivers, respectively, in sync with a clock signal WECLK, and the write drivers each execute an operation in response to the select signal. By so doing, the source line will be at a high potential, whereupon a current Ic flows from the source line SL to the bit line BL. The current Ic is driven by both (DRB1, DRB2) and (DRS1, DRS2). WECLK comes to a stop, and WES1 is changed over to non-selection, whereupon the step 1 is completed. Next, WES2 is changed over to selection, whereupon writing in the step 2 starts. Subsequent to the selection of WES2, outputting from LC, according to the table of FIG. 18, is enabled, and LC outputs the select signals PB1 to NS2 to the write drivers, respectively, in sync with the clock signal WECLK, and the write drivers each execute an operation in response to the select signal. By so doing, the bit line will be at a high potential, whereupon the current Ic flows from the bit line BL to the source line SL. The direction of the current is reversed this time, and the current is small in value because the current is driven by DRB2, and DRS2. WECLK comes to a stop, and WES2 is changed over to non-selection, whereupon the step 2 is completed. Thus, multi-valued information can be written to a memory cell by adoption of the configuration example in FIG. 17, and the operation example in FIG. 19.

Figure 20:
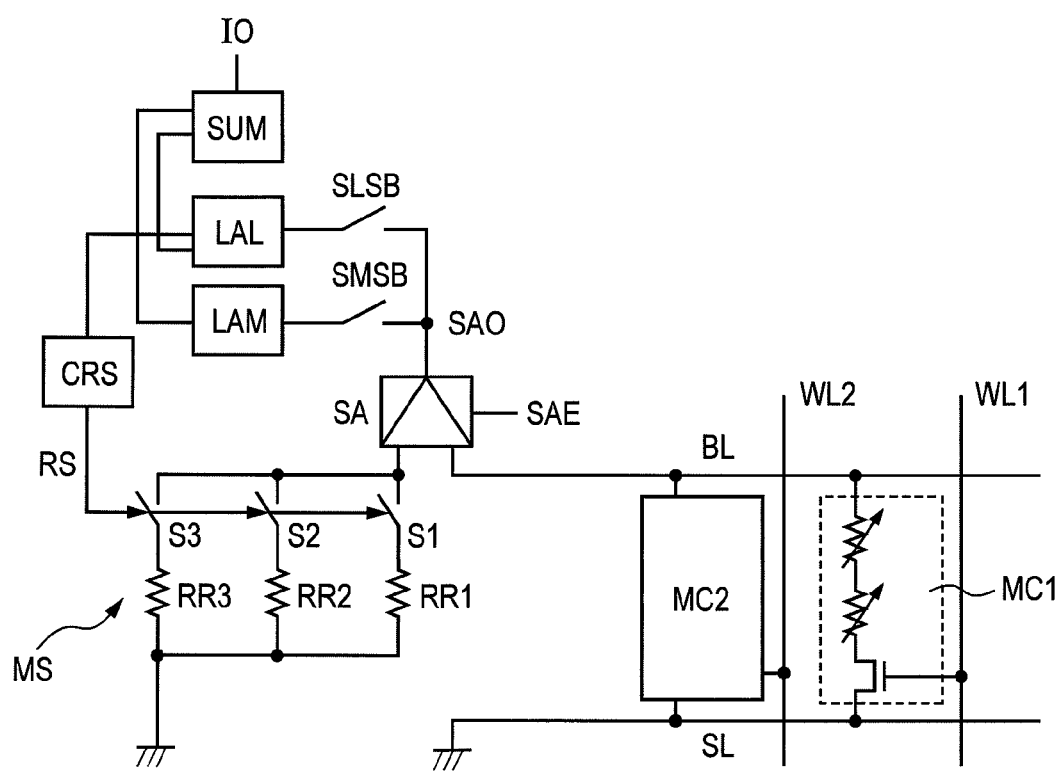
FIG. 20 is a view showing a detailed configuration of a block for use in execution of reading in FIG. 1 by way of example.

FIG. 20 is a circuit block diagram showing a configuration example of a read system circuit of the semiconductor recording device according to the first embodiment. The bit line BL connected to a memory cell MC1 is connected to one of the inputs of the sense amplifier SA controlled by an activation signal SAE. At this point in time, the source line SL is at a ground potential, and a memory cell to be read is selected by the word line WL. A reference cell MS is connected to the other of the inputs of the sense amplifier SA. MS is provided with three reference resistances (referred to as RR1, RR2, and RR3, described in increasing order of value), each thereof, having a resistance value corresponding to an intermediate value between two resistance values adjacent to each other among the four resistance values that a memory cell can have, as shown in FIG. 2, and switches S1, S2, S3 for selecting only a necessary resistance among the three reference resistances, in response to an output RS of a control circuit CRS. RS indicates select signals for the three resistances as a whole. If the respective values of the reference resistances RR1, RR2, RR3 are decided as above, granting that there occurs the characteristic shown in FIG. 9 (b), a read current can be set to a small value (for example, around 1/10 of the write current value), thereby enabling writing with a margin to be executed.

Two latch circuits LAM, LAL are connected to an output SAO of the sense amplifier SA, and a signal for use in selection on which of the latch circuits the sense amplifier SA should be connected is SMSB, SLSB, respectively. Further, CRS is made up such that the switches S1, S2, and S3 can be selected through the output signal RS of CRS, in response to the contents of LAL as well. LAM is a latch for storing a result that is read by use of the reference resistance selected in response to the contents of LAL. SUM is a circuit block for restoring two-bit information from data of LAM as well as LAL.

Figure 21:
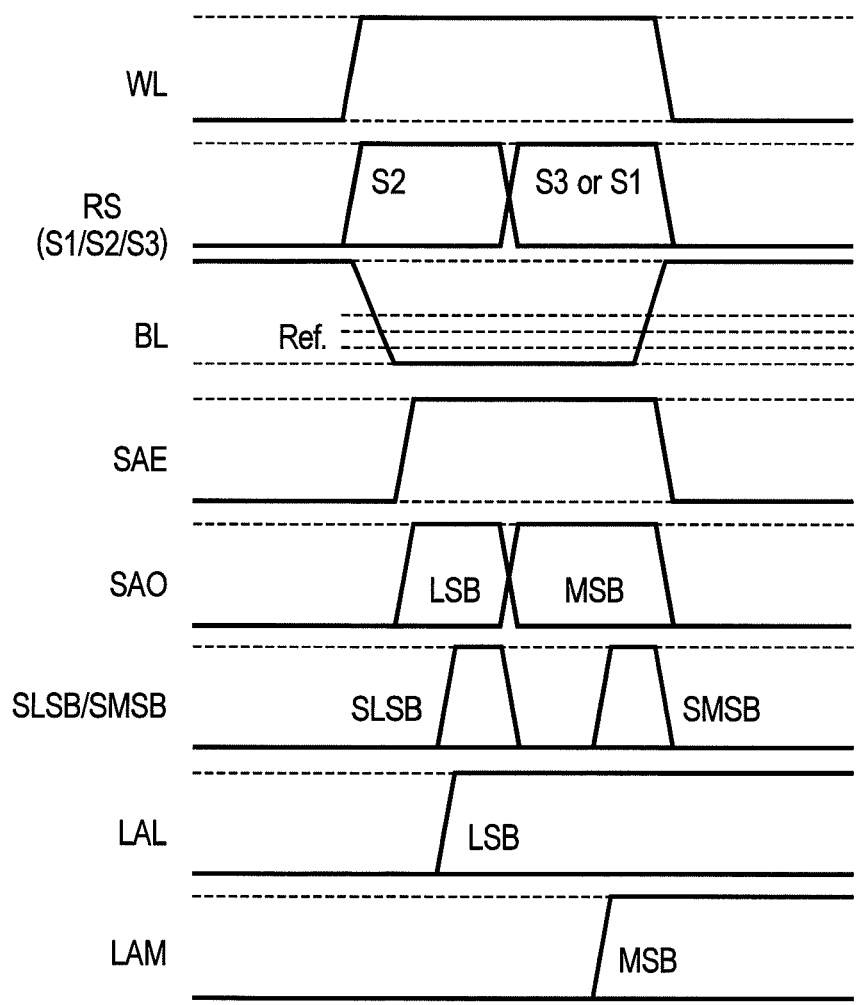
FIG. 21 is a view showing an operation in FIG. 20 by way of example.

With the use of the configuration example described as above, multi-valued information can be read. Reading as well is executed in two steps. This operation example is shown in FIG. 21. First, a first step is executed by use of the intermediate resistance RR2 among the three reference resistances. When the word line WL is selected, a current flows from the bit line BL pre-charged beforehand to a memory cell, whereupon a potential drops. At this point in time, only S2 of the switches in the three reference resistances is selected by the select signal RS. When the sense amplifier SA is activated by the sense amplifier enable signal SAE having appropriate timing, the sense amplifier SA identifies a difference between a current flowing through the bit line BL, reflecting the information of the memory cell, and a current flowing through the reference resistance RR2, as a direct or equivalent difference in voltage value. This result is stored in the latch circuit LAL by a switch SLSB. Thus, a result of comparison of RR2 with the information of the memory cell is stored in LAL in the first step.

Herein, if the memory cell is higher in resistance, the information piece of the memory cell is "11" or "01", as shown in FIG. 2. At this point in time, "1" is stored in the latch circuit LAL. In order to discriminate between "11" and "01" by reading, a resistance at a value between the two high resistances is required for use as a reference. This is the resistance RR3. Meanwhile, if the memory cell is lower in resistance, the information piece of the memory cell is "10" or "00", and at this point in time, "0" is stored in the latch circuit LAL. In order to discriminate between "10" and "00" by reading, a resistance at a value between the two low resistances is required for use as a reference. This is the resistance RR1.

Figure 47:
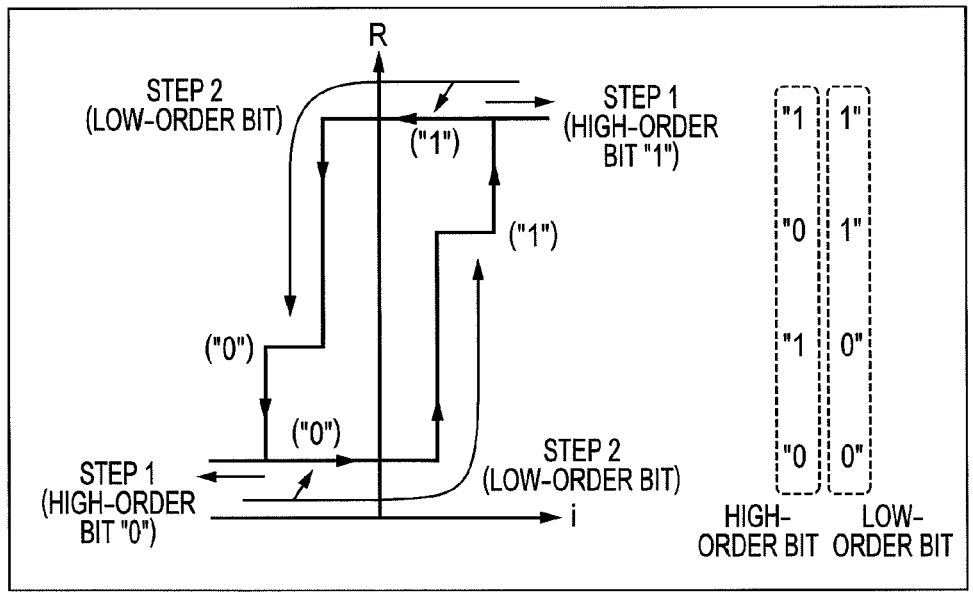
FIG. 47 is a conceptual view showing flow of a write-operation in the semiconductor recording device according to the first embodiment of the invention.
Figure 48:
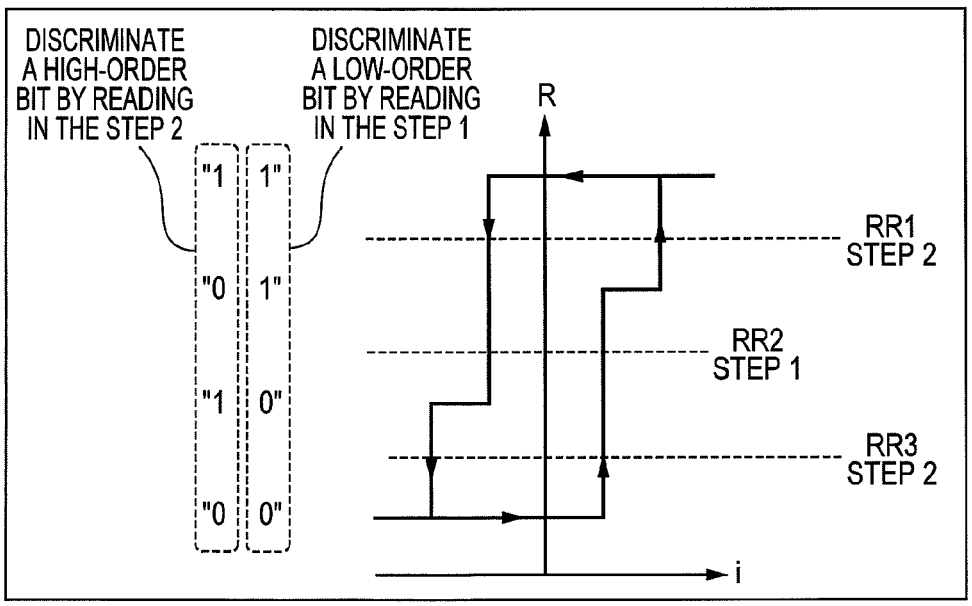
FIG. 48 is a conceptual view showing flow of a read-operation in the semiconductor recording device according to the first embodiment of the invention.

In the next step, CRS therefore makes selection on either S3 for selecting RR3 or S1 for selecting oRR1 according to the result stored in LAL. With the use of the reference resistance as selected, a difference between the current flowing in the memory cell and a current flowing through this reference resistance is similarly detected by the sense amplifier This result is stored in the latch circuit LAM by a switch SMSB. If the resistance of the memory cell is higher as compared with the reference resistance RR1, or RR3, respectively, "1" is stored, and if the resistance of the memory cell is lower, "0" is stored. Thus, information items written to this memory cell can be obtained from the respective information items stored in the two latch circuits. A composite circuit SUM fetches a high order bit as an information piece of LAM, and a low order bit as an information piece of LAL, thereby outputting the information items to IO. Further, conversion is required at this point in time in order that correspondence between the resistance state and two-bit data is caused to match the same at the time of writing; however, since the resistance state is identical, the conversion can be easily executed. More specifically, in the case of this example, if LAM is "1", and LAL is "1", the memory cell is in the highest resistance state, that is, both of the two TMR elements are in the anti-parallel state. The resistance state becomes "11" if expressed in the alignment sequence of LAM, and LAL, corresponding to RAP1+RAP2 in FIG. 2. Thus, the operation is executed in two steps at the time of reading as well; however, the present embodiment has a feature that the information piece on the low order bit at the time of writing is first obtained, a result of which is used to obtain an information piece on the high order bit. Further, in the two steps described with reference to FIG. 2, and so forth, the high order bit is decided during rewriting in the step 1, as shown in FIG. 47, and subsequently, the low order bit is decided in the step 2. Accordingly, the order of the information items becomes "11", "01", "10", and "00", in decreasing order of magnitude of the resistance against the written result. At the time of the reading thereof, described with reference to FIG. 20, and FIG. 2, the low order bit is identified in the reading using RR2, executed in the step 1, as shown in FIG. 48. Subsequently, in the step 2, the high order bit is identified by selecting RR1 or RR3 by use of this information.

With the semiconductor recording device according to the present embodiment described as above, the information piece of the TMR element (TMR1) large in area, where a current necessary for writing is large, but a resistance is small, is assigned to the high order bit, while the information piece of the TMR element (TMR2) small in area, where a current necessary for writing is small, but a resistance is large, is assigned to the low order bit, as shown in the bit assignment described with reference to, for example, FIG. 2. And, at the time of writing, the writing is sequentially executed by starting from the TMR element (TMR1) large in area, where the current necessary for writing is large, while at the time of reading, the reading is sequentially executed by conversely starting from the TMR element (TMR2) small in area, (resistance is large), as shown in the bit assignment described with reference to, for example, FIG. 2. This scheme is applicable even to the case where the number of bits per cell is further expanded. Assignment to the high order bit is sequentially executed by starting from, for example, the TMR element large in area, and writing is sequentially executed by starting from the TMR element (the high order bit) large in area, while reading is sequentially executed by starting from the TMR element (the low order bit) small in area, thereby enabling adequate writing, and efficient reading. The bit assignment, as shown in FIG. 2, represents an assignment method suitable for application to such a writing method, and a reading method as described, however, the assignment method is not necessarily limited thereto, and needless to say, changes as appropriate may be made thereto. However, the bit assignment is preferably executed to the TMR elements in deceasing order of size, and therefore, by sequentially starting from the high order bit (or may be from the low order bit instead) in order to facilitate control of writing and reading.

As described in the foregoing, with the use of the semiconductor recording device according to the present embodiment, it becomes possible to typically realize a multi-valued semiconductor recording device that is easy to manufacture, small in a memory cell area, being capable of simply writing and reading information by making use of the magneto-resistance change.

(Second Embodiment)

As described in the first embodiment of the invention, for multi-valued writing and reading, it is necessary to execute data conversion by adequately partitioning a bit row, changing an information piece to be written into an information piece on the direction or the value of a current of a write pulse, putting an information piece on a resistance as read into a bit row, and so forth. There has so far been given an explanation centering around the configuration example in which the plural latches are incorporated in the memory cell array to thereby perform processing for the conversion. Meanwhile, another scheme whereby a memory cell array in a form as simple as possible is adopted, and necessary data conversion is executed on a chip or outside a chip can be cited as another promising embodiment of the invention. There is described hereinafter this embodiment of the invention. The present embodiment has a feature in that as progress is made toward higher integration, so a memory cell array need be as high as possible in density, however, if a memory cell array is laid out so as to enable the data conversion without causing all part thereof to be activated by one operation such as writing, and so forth, this will enable a degree of integration as well as performance of a chip to be enhanced.

Figure 22:
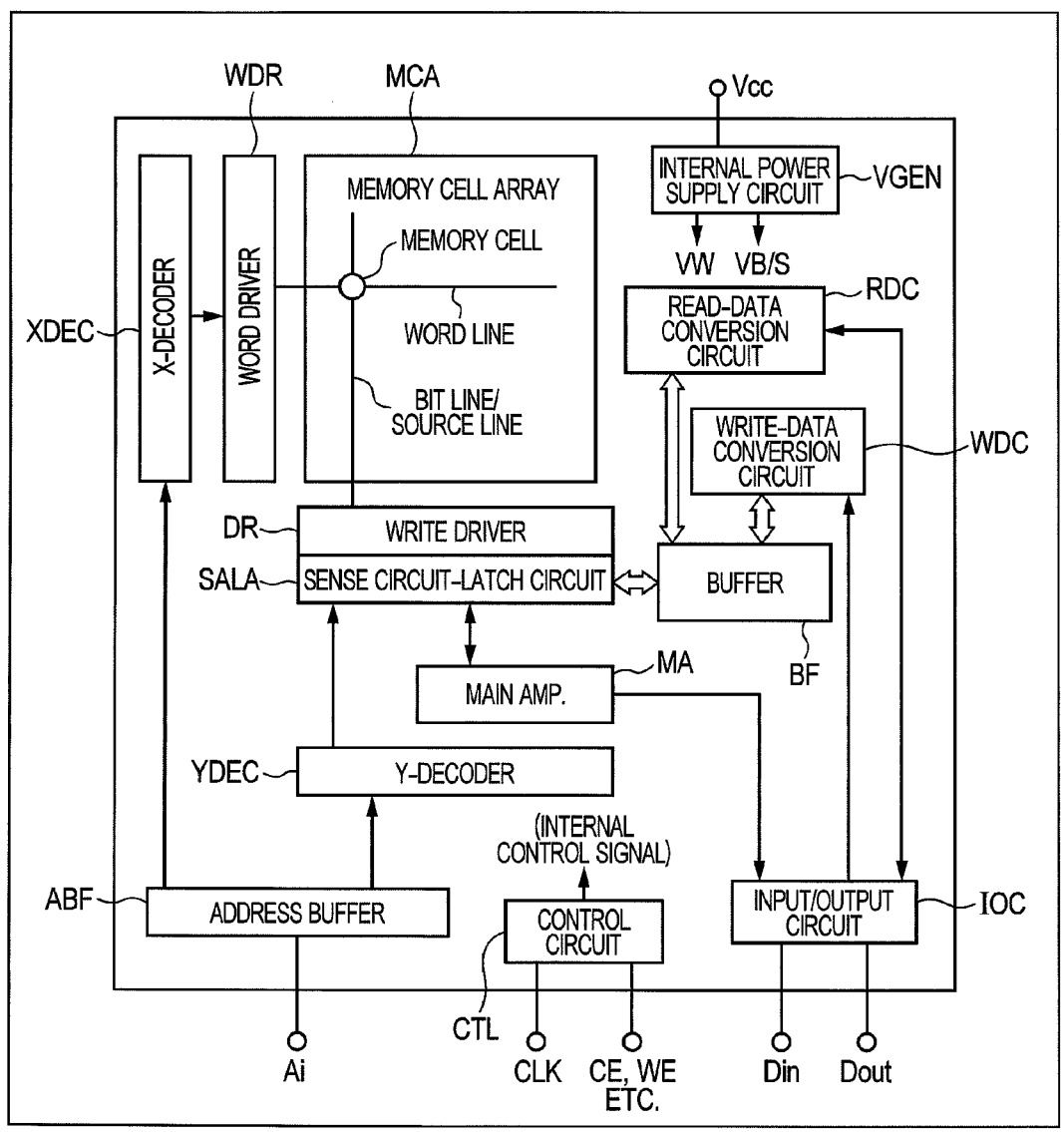
FIG. 22 is a block diagram showing one example of the whole configuration of a semiconductor recording device according to a second embodiment of the invention.

FIG. 22 is a block diagram showing one example of the whole configuration of a semiconductor recording device according to a second embodiment of the invention. The semiconductor recording device shown in FIG. 22 has a main feature in that a function for generating and converting data necessary for a multi-valued operation is incorporated outside a memory cell array region (a memory cell array, and immediately peripheral circuits thereof) formed on, for example, one semiconductor chip. A memory cell array MCA includes a multitude of memory cells MCs, each memory cell MC being provided with plural TMR elements, and a selection transistor, per one cell, thereby being made to correspond to not less than 2 bits information. The memory cell MC is connected to a word line WL, and bit line BL/source line SL, respectively. Typically, there is shown one length each of the word line WL, and the bit line BL/the source line SL. A word driver WDR drives the word line WL on the basis of a select signal outputted from an X-decoder XDEC. A write driver DR, and a sense circuit-latch circuit SALA are provided on one end side of the bit line BL/the source line SL. Further, the bit line BL/the source line SL is selected on the basis of a select signal outputted from a Y-decoder YDEC, and information piece of a select bit line at the time of writing is sent out to the sense circuit-latch circuit. The word driver WDR, write driver DR, and sense circuit-latch circuit SALA are called as the immediately peripheral circuits.

An address signal is supplied from an address buffer ABF to the X decoder XDEC, and the Y decoder YDEC, respectively. An operating voltage required by an operation such as writing, reading, and so forth is generated by an internal power supply circuit VGEN based on an external power supply source Vcc. The internal power supply circuit generates, for example, a word line voltage VW, a bit line BL/the source line voltage VB/S, and so forth. A control circuit CTL receives access-control signals (CE, WE, etc), and a clock signal from outside to generate an internal control signal according to signals in order to control writing as well as reading of a memory cell, thereby controlling the internal circuits of a memory, as a whole. An information item that is read out of the memory cell and subjected to a predetermined conversion (as described later on) is sent out to an input/output circuit IOC via a main amplifier to be subsequently outputted to Dout.

The input/output circuit fetches write-bit information from Din to be sent out to a write-data conversion circuit WDC. In FIG. 22, the write-data conversion circuit WDC, a read-data conversion circuit RDC, and a buffer BF for provisionally keeping those converted data items are provided outside the memory cell array region. With the memory described with reference to FIGS. 17, and 20, respectively, a latch circuit of the immediately peripheral circuit is caused to provisionally hold data to be written, or data that has been read out of the memory cell at the time of writing or reading, thereby executing conversion of the data into data to be written to the memory cell, or data to be read out to outside. However, with the memory shown in FIG. 22, the buffer BF is provided in a chip of the memory in order to exclusively perform such functions as described, thereby causing the buffer to provisionally hold the data. Operations at the time of writing, and at the time of reading, respectively, are the same as the contents of the explanation given so far; however, the memory according to the present embodiment differs in that the buffer on the chip is used for the data conversion. Further, a memory cell array on a chip is generally divided into several blocks, or banks, and all the blocks, or the banks are not activated at one time. Accordingly, for the buffer, use may be made of a latch circuit provided in a memory cell array block other than a memory cell array block on which attention is focused.

Figure 23:
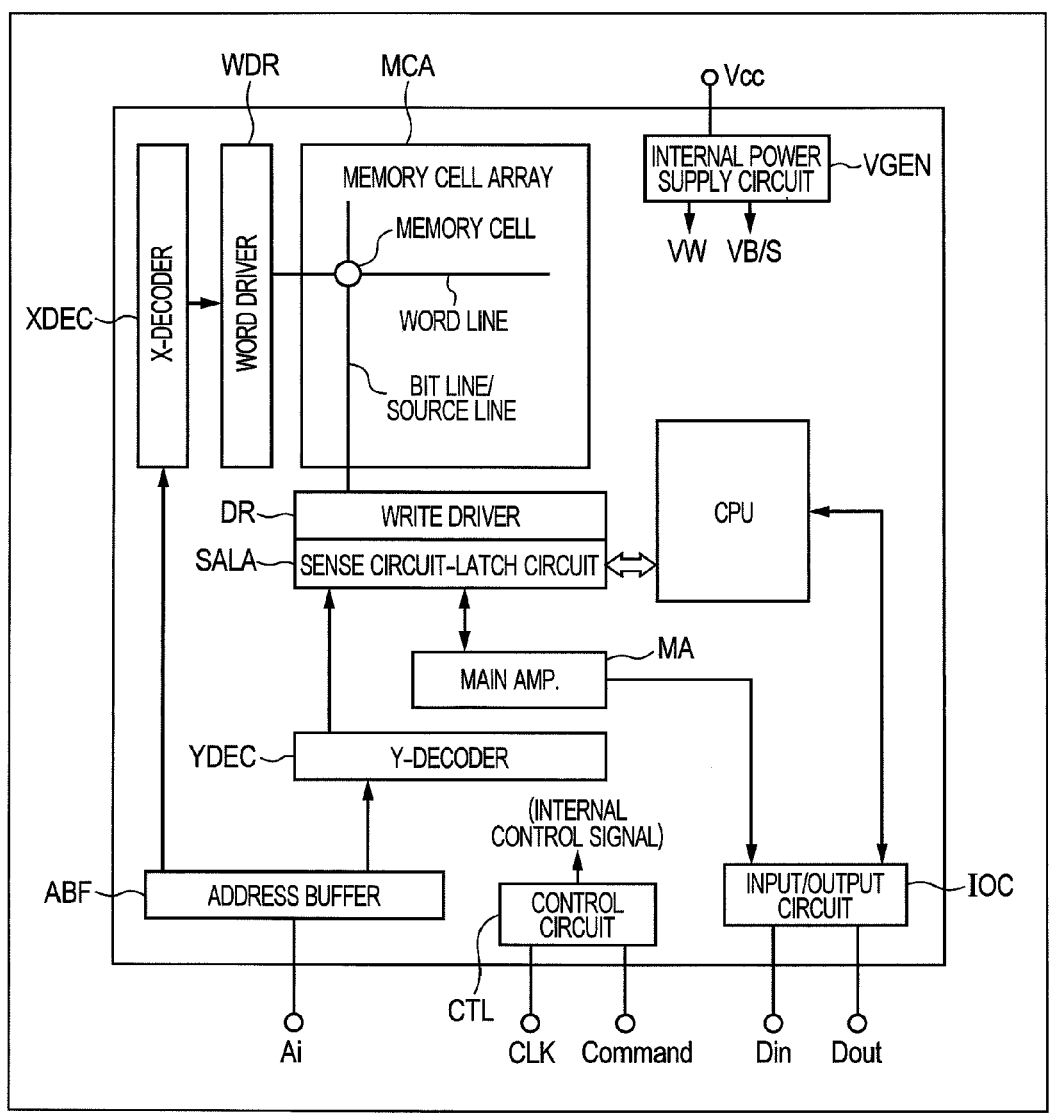
FIG. 23 is a view showing a variation to FIG. 22 by way of example.

In FIG. 23, there is shown a configuration example differing from that shown in FIG. 22. A CPU is incorporated in this semiconductor recording device. The CPU means a circuit block corresponding to a central processing unit or a microprocessing unit. This CPU realizes various functions for controlling the conversion of write-data, and the conversion of read-data, as thus far described, and transfer of the data at that time. An operation program of CPU, for realization of those functions, is stored in a memory circuit (use may be made of one using a TMR element) incorporated therein, or another on-chip memory (not shown).

Figure 24:
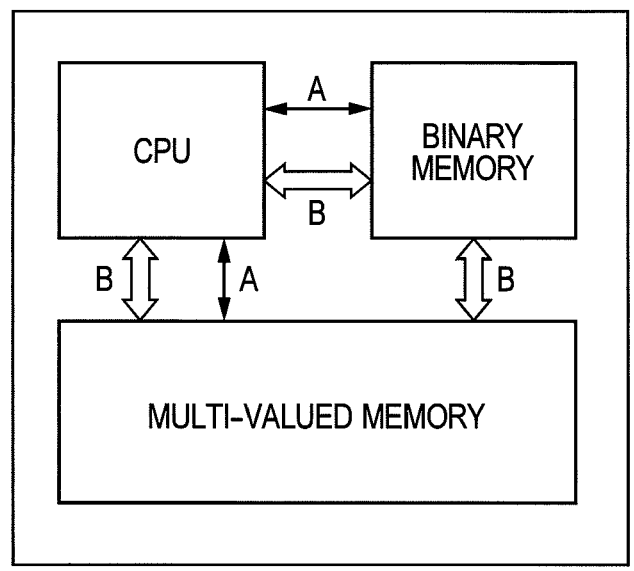
FIG. 24 is a view showing a variation to FIG. 23 by way of example.

In FIG. 24, there is shown an example where the memory on a single chip, shown in FIGS. 23, 24, respectively, is formed on multi-chips. More specifically, a semiconductor recording device (semiconductor device) shown in FIG. 24 is of a configuration where, for example, three chips in stacked layers are mounted, and the three chips are a multi-valued memory chip, a CPU chip, using a memory element according to the present embodiment, respectively, and a binary memory chip using, for example, a TMR element. The multi-valued memory chip has a circuit configuration where an arithmetic and program control is not incorporated against the memory of FIG. 23, or the write conversion circuit and the read conversion circuit are not provided against the memory of FIG. 1. At the time of data conversion in a write operation, and a read operation, respectively, data is transferred to a binary memory to be provisionally held therein, whereupon CPU executes conversion of the data, thereby performing writing of data of 4-valued resistances to one memory cell, or reading of data of 4-valued resistances, stored in one memory cell. In FIG. 24, A denotes a control signal, and B denotes a signal line for addressing, and data.

Figure 25:
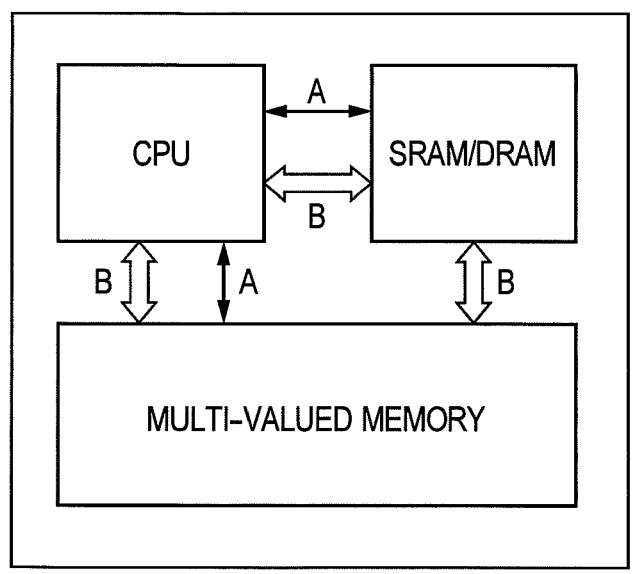
FIG. 25 is a view showing a variation to FIG. 24 by way of example.

A circuit shown in FIG. 25 differs from the circuit shown in FIG. 24 in that a DRAM (Dynamic Random Access Memory) or a SRAM (Static Random Access Memory) is substituted for the binary memory chip included in the circuit configuration shown in FIG. 24. With this circuit configuration of FIG. 25, at the time of data conversion in the write operation, and the read operation, respectively, data is transferred to SRAM/DRAM to be provisionally held therein, whereupon CPU executes the conversion of the data held in the SRAM/DRAM, thereby carrying out writing or reading. In FIG. 25, A denotes a control signal, and B denotes a signal line for addressing, and data.

(Third Embodiment)

A semiconductor recording device according to the present embodiment is the multi-valued semiconductor recording device capable of storing not less than two-bit in one memory cell, as described in the first embodiment. However, the semiconductor recording device according to the present embodiment can also be used as a binary semiconductor recording device. Further, mixed presence of a multi-valued memory region and a binary memory region is possible. In the binary memory region, the number of the steps in a reading operation or a writing operation is fewer than in the multi-valued memory region, and the operation is simpler, enabling a high speed operation, or low power consumption, so that it is useful to make proper use of an operation mode to thereby use the device either as a multi-valued memory, or as a binary memory, otherwise to make proper use of the multi-valued memory region, and the binary memory region on the same chip in order to realize desired performance.

Figure 26:
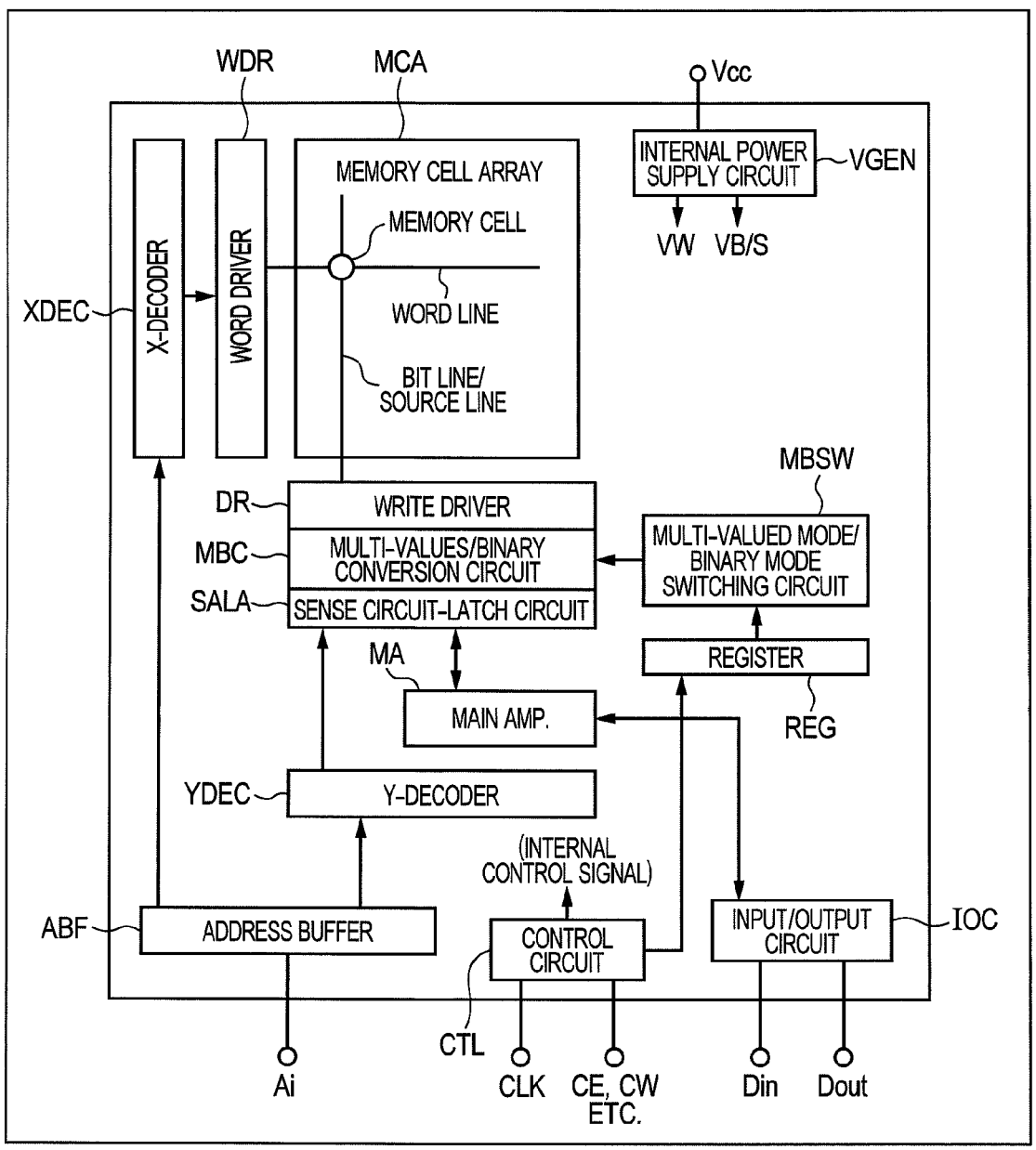
FIG. 26 is a block diagram showing one example of the whole configuration of a semiconductor recording device according to a third embodiment of the invention.

FIG. 26 is a block diagram showing one example of the whole configuration of a semiconductor recording device according to a third embodiment of the invention. The semiconductor recording device shown in FIG. 26 has a feature in that there are provided a setting register REG, a multi-valued mode/binary mode switching circuit MBSW for switching between a multi-valued mode and a binary mode on the basis of information from the setting register, and a multi-values/binary conversion circuit MBC for controlling whether or not data conversion between multi-values and binary is executed in response to an output from the switching circuit MBSW. If the multi-valued mode is designated, the multi-values/binary conversion circuit executes such a control as to assign, for example, two-bit to one memory cell, as described in the case of the first embodiment while if the binary mode is designated, the multi-values/binary conversion circuit executes such a control as to assign 1-bit to one memory cell, as described later on. Further, a conversion circuit for executing data conversion between multi-values and binary is either embedded in a circuit block for directly controlling an array, as shown in FIG. 26, or is located at another place on a chip, as described later on. In either case, there is provided a register for storing information for identifying the multi-valued mode, or the binary mode.

Figure 27:
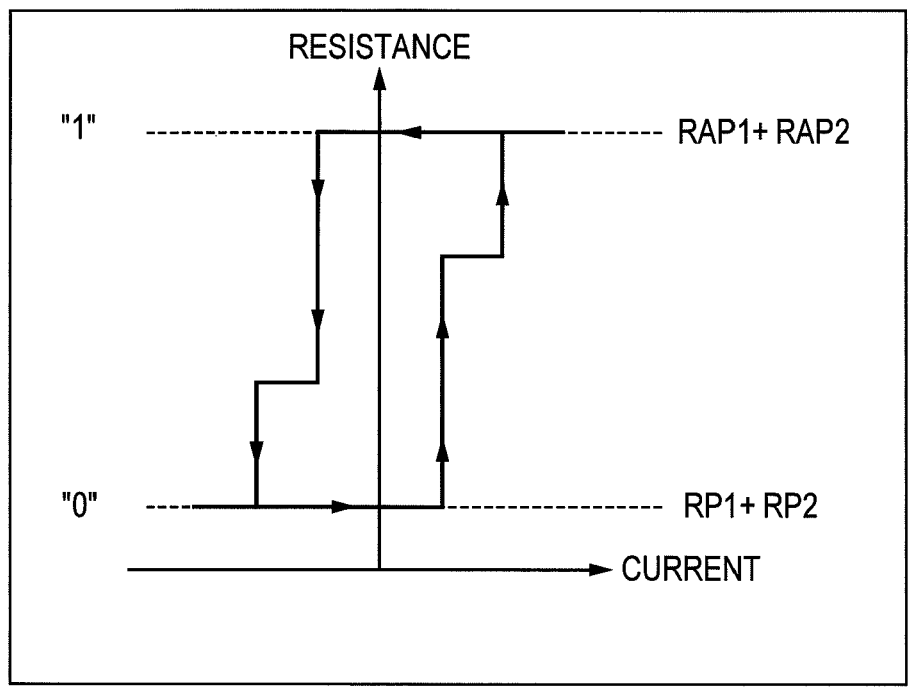
FIG. 27 is a view showing an operation in FIG. 26 by way of example.

There are described hereinafter the contents of a characteristic operation of a memory cell when used as a binary memory in the case of the semiconductor recording device being used in the binary mode, or in a mode incorporating mixed presence of the multi-valued memory region and the binary memory region. FIG. 27 is a hysteresis showing an operation example of the memory cell when the multi-valued memory is used as the binary memory in the semiconductor recording device according to the third embodiment. The memory cell is of, for example, a configuration shown in FIG. 1. With the present embodiment, two states, including a state where both the two TMR elements shown in FIG. 1 are in the anti-parallel state, and a state where both the two TMR elements are in the parallel state are used as storage of information. More specifically, "1" in FIG. 27 indicates a state where a current sufficient to cause either of TMR1, and TMR2, larger in area, to be written into the anti-parallel state, and accordingly, the TMR element smaller in area is also turned into the anti-parallel state, resulting in the combined resistance at a value of RAP1+RAP2. Further, "0" indicates a state where a current sufficient to cause either of TMR1, and TMR2, larger in area, to be written into the parallel state, and accordingly, the TMR element smaller in area is also turned into the parallel state, resulting in the combined resistance at a value of RP1+RP2. Use of a scheme of FIG. 27 has a feature that a difference in resistance between the two states can be increased, so that the reading operation can be speedily performed. Further, because the difference in resistance between the two states can be increased, the scheme is advantageous, for example, at the time of storing data requiring high reliability.

Figure 28:
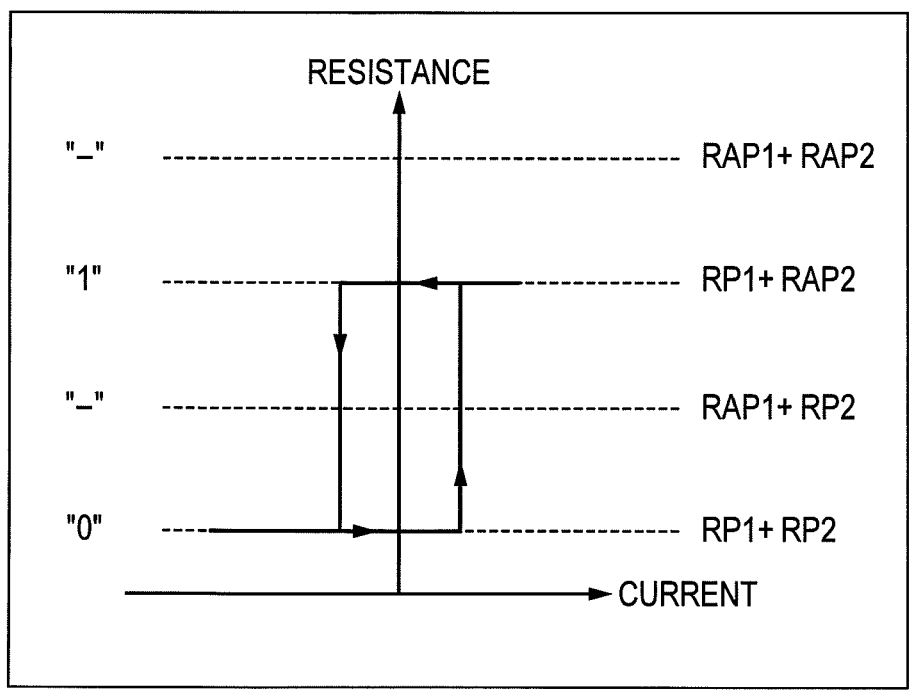
FIG. 28 is a view showing another operation in FIG. 26 by way of example.

FIGS. 28, 29 each show an operation example differing from that shown in FIG. 27, as a hysteresis. A memory cell is of, for example, the configuration shown in FIG. 1. In FIGS. 28, 29, respectively, two states, including a state where TMR2 shown in FIG. 1, smaller in area, is in the parallel state, and a state where the TMR2 is in the anti-parallel state, are used as binary storage. A resistance value thereof, at this point in time, varies depending on whether a state of TMR1 lager in area is in the parallel state (FIG. 28), or in the anti-parallel state (FIG. 29). Selection on whichever state can be decided on a chip-by-chip basis, on a case-by-case basis for use as binary, or on a region-by-region basis on a chip. This scheme has a feature in that once the state of TMR1 is determined, only TMR2 small in area is subsequently rewritten, so that control at a small current is possible.

(Fourth Embodiment)

Figure 31A:
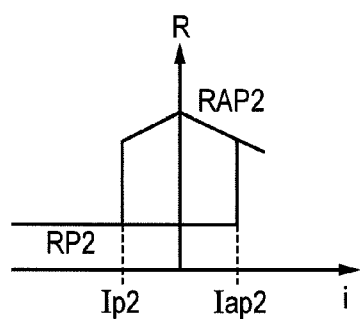
FIGS. 31 (a) to 31 (c) each are a view showing the properties of another one of the three TMR elements of FIG. 30 by way of example.
Figure 31B:
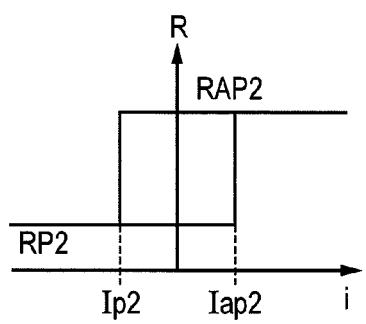
Figure 31C:
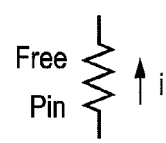
Figure 32A:
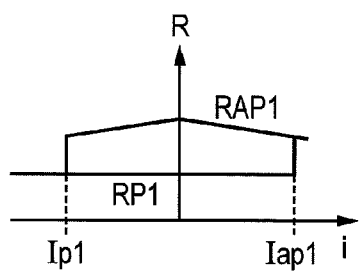
FIGS. 32 (a) to 32 (c) each are a view showing the properties of still another one of the three TMR elements of FIG. 30 by way of example.
Figure 32B:
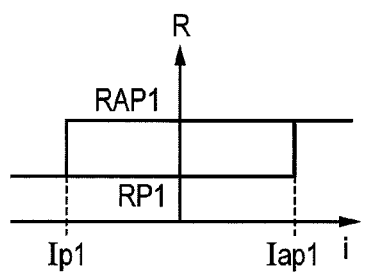
Figure 32C:
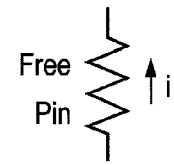

With the first embodiment described in the foregoing, explanation has been given by taking the case of two-bit/cell as an example. However, by expanding this, and by connecting TMR elements in n-stages in series to each other, a memory cell capable of storing n-bits/cell can also be built. Herein, there is described the case where a 3-bits/cell is made up by connecting TMR elements in 3-stages to each other. In the respective figures, (a) is a schematic diagram showing actual properties, (b) a schematic illustration ignoring current dependency of resistance in one state, and (c) shows a circuit sign. If the three TMR elements are defined R1, R2, and R3, respectively, R3 in FIG. 30 is the smallest in area, and a current necessary for writing is the smallest. R2 shown in FIG. 31 is larger in area than R3, but is smaller than R1. R1 shown in FIG. 32 is the largest in area, and accordingly, a current necessary for writing is the largest. R1, R2, R3, in the anti-parallel state, take resistance values RAP1, RAP2, RAP3, respectively, and R1, R2, R3, in the parallel state, take resistance values RP1, RP2, RP3, respectively.

Figure 33A:
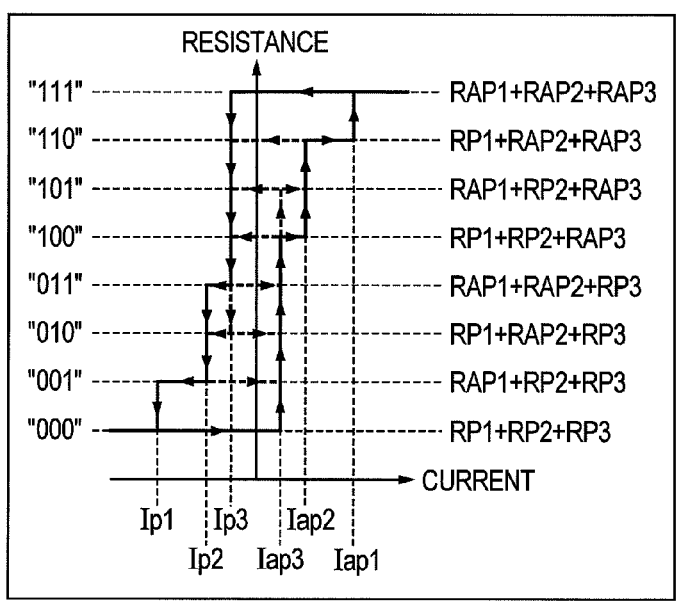
FIGS. 33 (a), 33 (b) each are a view showing the properties of the three TMR elements shown in FIGS. 30 to 32, respectively, in the case of the three TMR elements being connected in series by way of example.
Figure 33B:
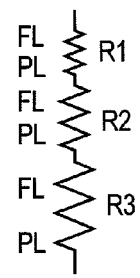

If the three TMR elements connected in series to each other are used in place of the two TMR elements connected in series, shown in FIG. 1, a 3-bits/cell is formed. FIG. 33 (*a*) shows a hysteresis in the case of the three TMR elements connected in series. The TMR elements depicted by use of the circuit signs are as shown in FIG. 33 (*b*). If the respective resistances of the three TMR elements, and large/small of a current necessary for writing are taken into consideration, the properties shown in FIG. 33 (*a*) will result. Thus, eight states of combined resistance values can be assumed. Eight states as 3-bits information can be made to correspond thereto. Accordingly, writing as well as reading of 3-bits information per one memory cell is enabled. This can be expanded to n-bits per memory cell. Thus, with the present embodiment, a high-density memory cell can be realized.

Figure 34:
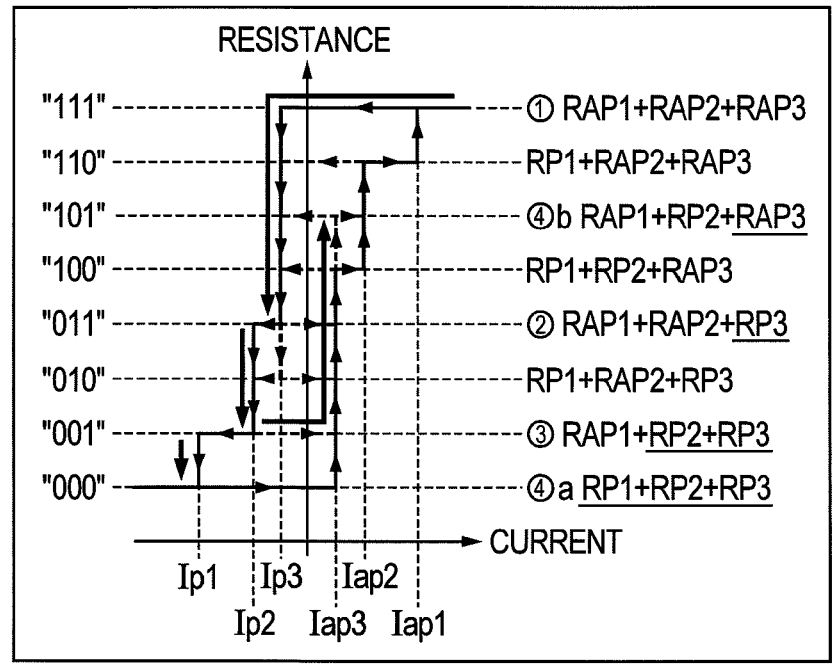
FIG. 34 is a schematic illustration for describing a part of a writing step in FIG. 33.
Figure 35:
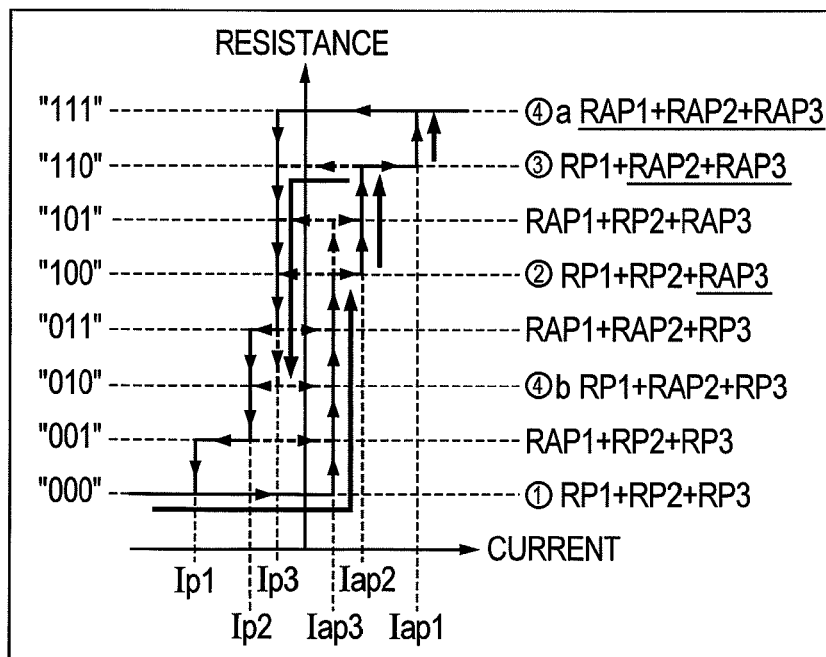
FIG. 35 is a schematic illustration for describing another part of the writing step in FIG. 33.

FIGS. 34, 35 each are a schematic representation showing writing steps in the memory cell of FIG. 33. This represents expansion of the example in the case of two-bit data, shown in FIGS. 2, 3, respectively. In FIG. 2, the respective information items of the TMR elements larger in area are sequentially assigned by starting from the high order bit, as described in the first embodiment, however, herein, there is shown the case where the respective information items of the TMR elements larger in area are sequentially assigned by starting from the low order bit in contrast to the case shown in FIG. 2. Accordingly, contrary to the case shown in FIG. 2, writing is sequentially executed by starting from the low order bit at the time of writing, and reading is sequentially executed by starting from the high order bit at the time of reading.

In FIG. 34, first, a current Iap1 capable of turning all the three TMR elements into the anti-parallel state is caused to flow. A combined resistance is at RAP1+RAP2+RAP3. A "111" state is realized by this, representing a step 1. Next, there is executed rewriting by a current flowing toward the parallel state, in the direction opposite to Iap1, as is the case with FIG. 3. In this step 2, the current value is either Ip3 capable of turning only R3 into the parallel state, or Ip2 capable of turning both R2, R3 into the parallel state. The current value can be set for every memory cell by a driver of a bit line/source line that is connected to the memory cell. As a result of writing in the step 2, a combined resistance RAP1+RAP2+RP3, or RAP1+RP2+RP3 can be realized. Information items "011", "001" are made associated therewith, respectively. Further, respective write operations by use of Ip3, and Ip2 may be sequentially executed as necessary. Further, with the memory cell where the combined resistance has turned to RAP1+RP2+RP3, rewriting to another state is possible in a step 3. More specifically, the direction of the current is again changed toward the anti-parallel state, and a current Iap3 capable rewriting only R3 is added thereto. By so doing, there can be created a state of the combined resistance at RAP1+RP2+RAP3, which is made associated with "101". As described above, the three states have been created out of a state of "111", where the three resistances are all turned into the anti-parallel state. Thus, four states in total are present. Additional four states can be realized by a method shown in FIG. 35, whereby writing for turning all the three resistances into the parallel state is executed in the step 1.

First, a current Ip1 capable of turning all the three TMR elements into the parallel state is caused to flow in the step 1, as shown in FIG. 35. A combined resistance realized by this is at RP1+RP2+RP3. This is defined as a "000" state. In the next step, there is executed writing by a current flowing toward the anti-parallel state, in the direction opposite to Ip1. The current value is either Iap3 capable of turning only R3 into the anti-parallel state, or Iap2 capable of turning both R2, R3 into the anti-parallel state. The current value can be set for every memory cell by the driver of the bit line/source line that is connected to the memory cell. Such writing as above represents the step 2, and a combined resistance RP1+RP2+RAP3, or RP1+RAP2+RAP3 can be realized. Information items "100", "110" are made associated therewith, respectively. With the memory cell where the combined resistance has turned to RP1+RAP2+RAGP3, rewriting to another state is possible in a step 3 by changing the direction of the current again toward the anti-parallel state, and adding a current Iap3 capable rewriting only R3 thereto. By so doing, there can be created a state of the combined resistance at RP1+RAP2+RP3, which is made associated with "010". As described above, three states have been created out of the state of "111", where all the three resistance are turned into the anti-parallel state. Four states in total are present. Thus, there haven been created a state where all the eight resistance values differ from each other, so that 3-bits per one cell writing is enabled. Further, since all the eight resistance values differ from each other, 3-bits per one cell reading is also enabled. An n-bits/cell operation that is implemented by series connection of TMR elements in n-stages can be realized by the same method described as above.

(Fifth Embodiment)

Figure 38A:
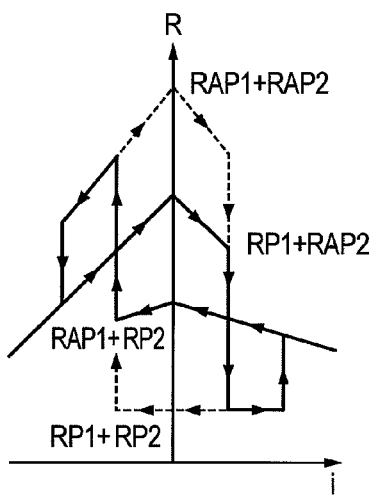
FIGS. 38 (a) to 38 (c) each are a view showing the properties of the MR elements shown in FIGS. 36, 47, respectively, in the case of the TMR elements being connected in series by way of example.
Figure 38B:
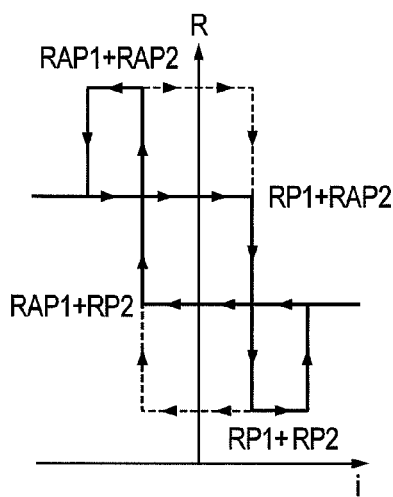
Figure 38C:
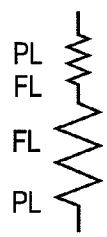

FIGS. 36 to 38 each show one example of the properties of TMR elements included in a semiconductor recording device according to a fifth embodiment of the invention, in which respective structures of two TMR elements, in the vertical direction, differ from those in the case of the first embodiment. More specifically, with TMR2 smaller in area, a free layer is disposed on a side of a cell, adjacent to a semiconductor substrate, and with TMR1 larger in area, a fixed layer is disposed on the side of a memory cell, adjacent to the semiconductor substrate. A structure inverted in this respect will do. FIG. 38 shows a hysteresis in the case where the memory cell is made up by connecting n series the two TMR elements of the structure as above to a selection transistor, as shown in FIG. 1. FIG. 36 shows a hysteresis of TMR1, FIG. 37 shows a hysteresis of TMR2, and (a) of each of these figures (FIG. 38 included) is a schematic diagram showing actual properties, (b) being a schematic illustration ignoring current dependency of resistance in one state, and (c) a circuit sign. As shown in FIG. 38 (b), the hysteresis differs from that in FIG. 11 in respect of the result of the combined resistance as a result of application sequence of the current necessary for writing, and a path getting thereto.

Accordingly, the present embodiment has a feature that a voltage applied to the element at the time of rewriting can be lowered, thereby enhancing reliability. More specifically, with the embodiments so far described, both TMR elements where the resistance value gets up to the maximum by rewriting at a large current in the step 1 are in the anti-parallel state. However, with the present embodiment, both TMR elements will not be in such a state as described, and one of the two TMR elements will be in the parallel state while the other will be in the anti-parallel state. Accordingly, the combined resistance of TMR elements as a whole will be lower in value, and a voltage generated on the basis of current×resistance will become lower than that in the case of the embodiments descried early on. This voltage is applied to a tunnel insulation layer of the TMR element; therefore, the lower the voltage is, the further stress acting on the tunnel insulation layer is reduced. That is, with the adoption of a configuration of the TMR element according to the present embodiment, the stress acting on the tunnel insulation layer can be reduced, thereby enhancing safety.

(Sixth Embodiment)

Figure 39:
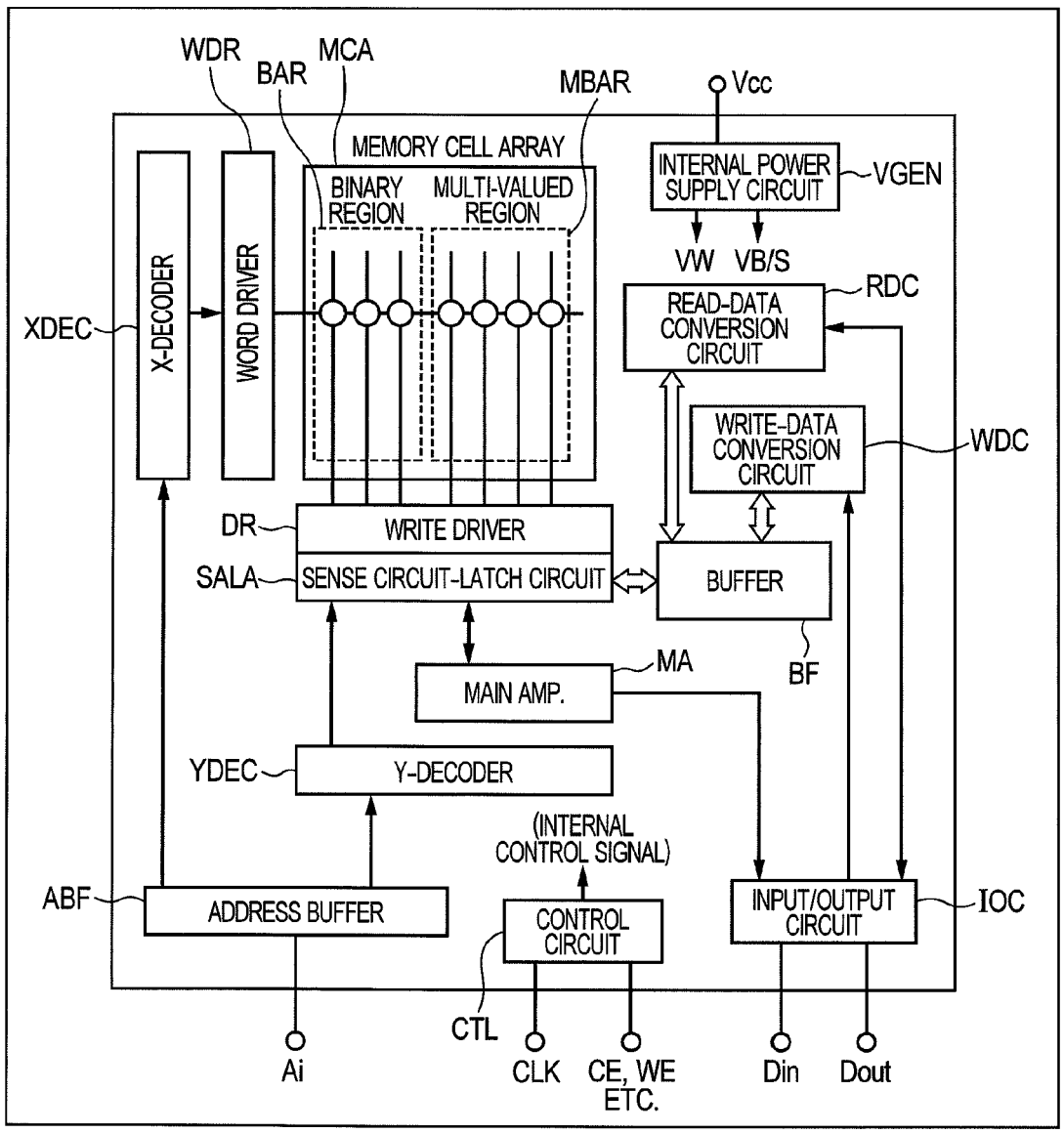
FIG. 39 is a block diagram showing one example of the whole configuration of a semiconductor recording device according to a sixth embodiment of the invention.

FIG. 39 is a block diagram showing one example of the whole configuration of a semiconductor recording device according to a sixth embodiment of the invention. The semiconductor recording device shown in FIG. 38 has a feature in that a binary region BAR and a multi-valued region MBAR are provided in a memory cell array MCA. With the present embodiment, a function for generating and converting data necessary for a multi-valued operation is incorporated outside a memory cell array region on a chip, as is the case with FIG. 22, although not necessarily restricted thereto. By so doing, the memory cell array has come simplified, thereby enabling both binary writing and reading, and multi-valued writing and reading to be realized.

Figure 40:
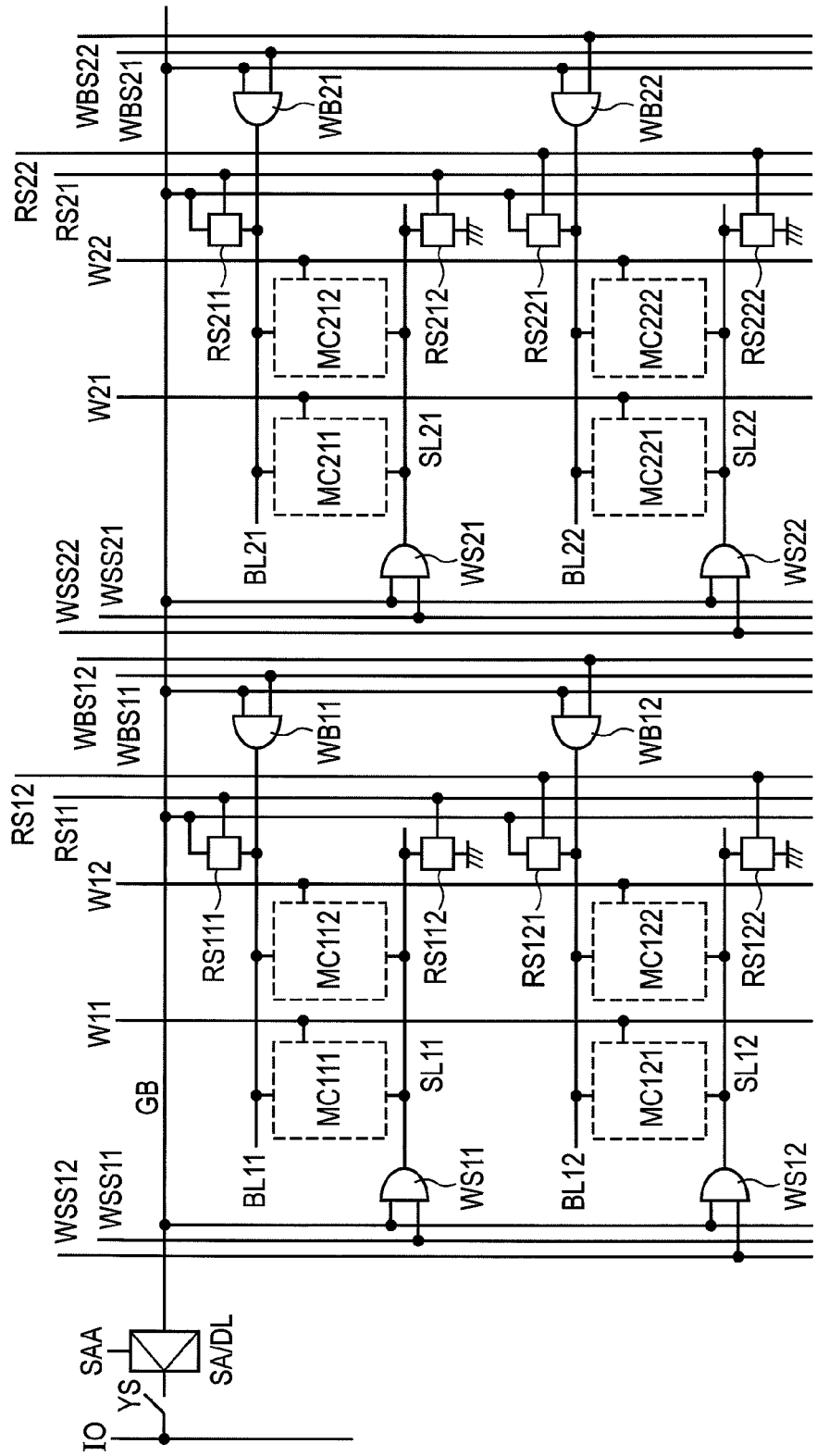
FIG. 40 is a view showing one example of a hierarchical structure of a bit line and a source line in FIG. 39.

The memory cell array MCA varies in configuration depending on whether the function for generating and converting data necessary for the multi-valued operation is prepared outside the memory cell array, as shown in FIGS. 22 to 25, and FIG. 39, or is incorporated inside the memory cell array, however, an operation that is higher in density, and safety can be realized by hierarchical structuring of the bit line/the source line of the memory cell array, as shown in a configuration example of FIG. 40. MC111 to MC222 each are a memory cell, and each memory cell is made up of a selection transistor, and a plurality of TMR elements, as shown in FIG. 1. In the figure, for example, the memory cell array including MC111, and MC112, and the memory cell array including MC211, and MC212 are each connected to lower local bit lines BL11, BL21, and lower local source lines SL11, SL21, respectively. GB denotes an upper bit line (global bit line), and a plurality of the lower local bit lines BL11 to BL22, and a plurality of the lower local source lines SL11 to SL22 are prepared for GB. Further, as a plurality of local bit lines and a plurality of local source lines are disposed in the direction vertical to GB, as well, there are prepared a plurality of select signal lines WBS11 to WBS22, and a plurality of select signal lines WSS11 to WSS22. The same applies to reading, and a plurality of select signal lines RS11 to RS22 are prepared in the direction vertical to GB, as well, in order to select the plural local bit lines; and the plural local source lines.

A write driver is prepared for the local bit line, and the local source line, respectively. For example, a bit line driver WB11, and a source line driver WS11 are available for BL11, and SL11, respectively, and a bit line driver WB12, and a source line driver WS12 are similarly available for BL12, and SL12, respectively. One of inputs of these drivers is connected to GB, and the other of the inputs is connected to WBS11, WSS11, WBS12, WSS12, and so forth, serving as the select signal line. In this case, the bit line driver is disposed on a side of the array made up of each of the local bit lines, each of the local source lines, and the memory cells, opposite from the source line driver.

Further, there are disposed RS111 to RS222 for use ion selective grounding of the global bit line, and a local bit line, and selective grounding of a local source line in order to execute reading. RS11 to RS22 denote respective selection signals of RS111 to RS222. A sense amplifier/write latch SA/DL doubling as a sense amplifier, and a data latch for writing is connected to GB, and an activation signal of SA/DL is SAA, an input/output terminal thereof being IO. The result of an operation of the sense amplifier, or data for writing is exchanged between the sense amplifier/write latch SA/DL and the input/output terminal IO via a switch controlled by a Y-select signal YS. There is either the case where passing of data that has been converted for the multi-valued operation is executed via the input/output terminal IO or the case where conversion between multi-values and binary values is executed inside the array by use of the circuit depicted in the respective embodiments described in the foregoing.

According to the configuration example of FIG. 40, the memory cells are few in number, and the local bit line and the local source line are disposed for every memory cell, so that a necessary and sufficient current for writing can be supplied to the memory cell. As the local bit line and the local source line each are small in parasitic capacitance, power consumption is small. Further, as the local bit line and the local source line each are small in parasitic resistance as well, a voltage drop is also small, so that writing at a low voltage is enabled. Further, since the bit line driver is disposed on the side of the array, opposite from the source line driver, in addition to a configuration, location dependency of which is small in the first place, it is possible to further reduce memory-cell location-dependency of a current path. As a result, many differences in resistance value, necessary for realization of multi-values, can be realized with high precision.

(Seventh Embodiment)

Figure 41:
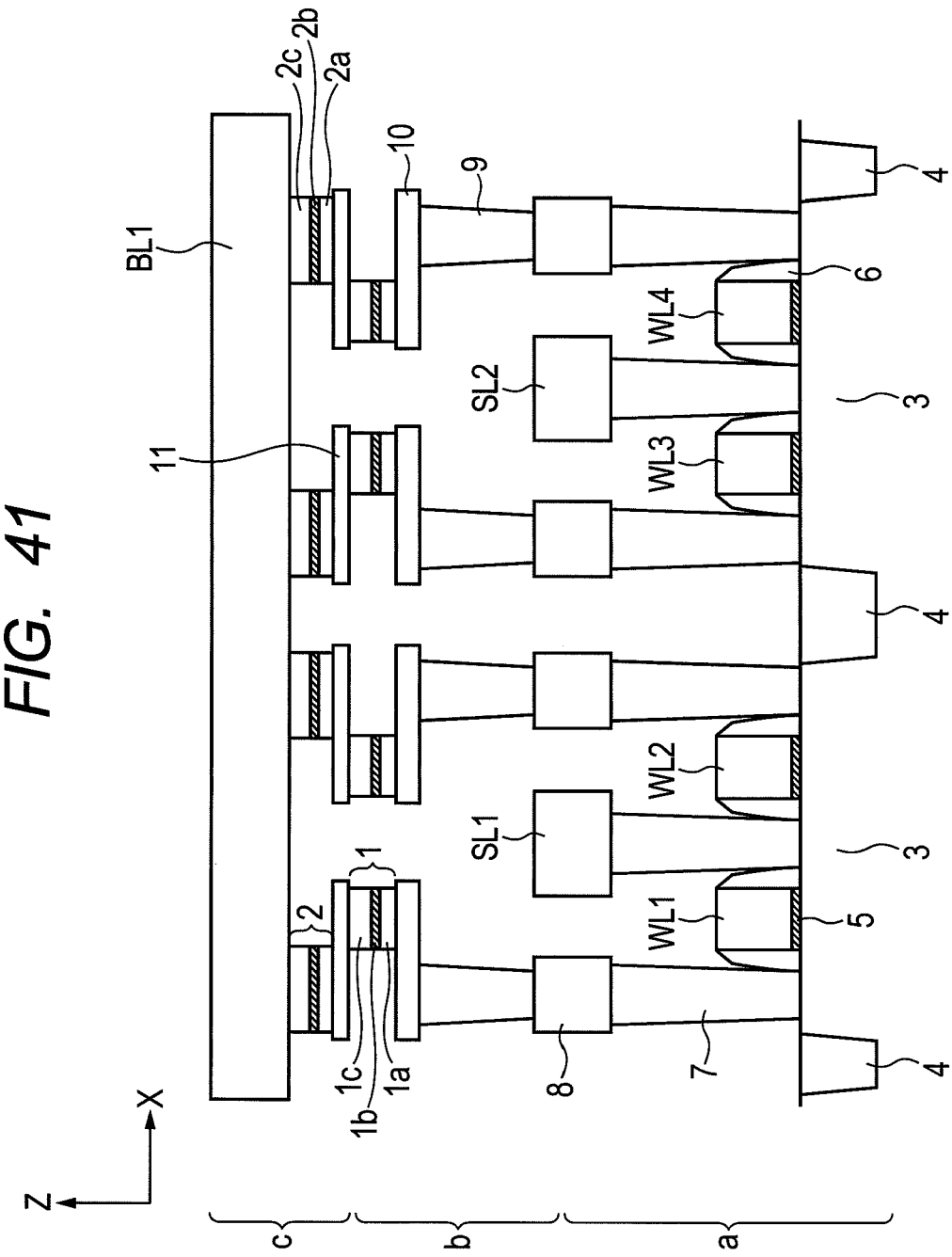
FIG. 41 is a sectional view showing an example of the structure of a memory cell in a semiconductor recording device according to a seventh embodiment of the invention.

FIG. 41 is a sectional view showing an example of the structure of a memory cell used in a semiconductor recording device according to a seventh embodiment of the invention. The semiconductor recording device shown in FIG. 41 is made up of memory cells, each thereof, including a MOSFET (transistor) formed on a semiconductor substrate active region 3, and a plurality of magneto-resistance effect elements that are stacked, differing in area from each other. The transistor of the memory cell has a gate oxide film 5, and a gate electrode, and the gate electrode is shared by a plurality of the memory cells extended in the direction vertical to the plane of the figure, making up a word line WL. A source of the transistor is shared by the memory cells adjacent to each other in an x-direction in order to reduce a memory cell area to be connected to a source line SL via a contact hole 7. The source line SL is shared between the plural memory cells. A drain of the transistor is connected to a lower electrode 10 via a contact hole 7, an interconnection 8, and an inter-layer plug 9. A first magneto-resistance effect element 1 is disposed on the lower electrode 10, and a second lower electrode 11 is disposed on the upper end of the first magneto-resistance effect element 1. Similarly, a second magneto-resistance effect element 2 is disposed on the second lower electrode 11, and the upper end of the second magneto-resistance effect element 2 is connected to a bit line BL. The bit line BL is extended in the x-direction to be shared between the plural memory cells.

The first magneto-resistance effect element 1 and the second magneto-resistance effect element 2 each include ferromagnetic layers 1a, 2a, non-magnetic layers 1b, 2b, and ferromagnetic layers 1c, 2c, respectively. In this case, the first magneto-resistance effect element 1, and the second magneto-resistance effect element 2 are preferably formed so as to be identical in film makeup to each other, and to differ in element area from each other. By so doing, film formation and manufacturing can be facilitated, and it becomes possible to decide both a threshold current for writing, and an element resistance, depending on an element area. Furthermore, with the example of the structure shown in FIG. 41, the respective magneto-resistance effect elements 1, 2 are each formed on one material (the lower electrodes 10, 11), as compared with the example of the structure of FIG. 7, previously described. By so doing, with the respective magneto-resistance effect elements 1, 2, using a thin film at a nanometer level, planarization thereof can be realized with ease. Further, in this example of the structure, there is described the case of two magneto-resistance effect elements, where the second magneto-resistance effect element 2 is larger in area than the first magneto-resistance effect element 1. However, not less than three units of the magneto-resistance effect elements may be stacked, and it need only be sufficient to have a state where the magneto-resistance effect elements differ in area from each other regardless of stacking sequence. Further, in the figure, the first magneto-resistance effect element 1, and the second magneto-resistance effect element 2 are each laterally staggered against the longitudinal direction (the vertical direction). By so doing, there is gained a feature that the magneto-resistance effect element manufactured afterward in a manufacturing process (provided on the upper side) becomes insusceptible to the effect of a change in planarization of a metal layer of an upper layer, and so forth, caused by the magneto-resistance effect element that has been first manufactured. A similar viewpoint can apply to a variation of the example shown in FIG. 6.

Figure 42:
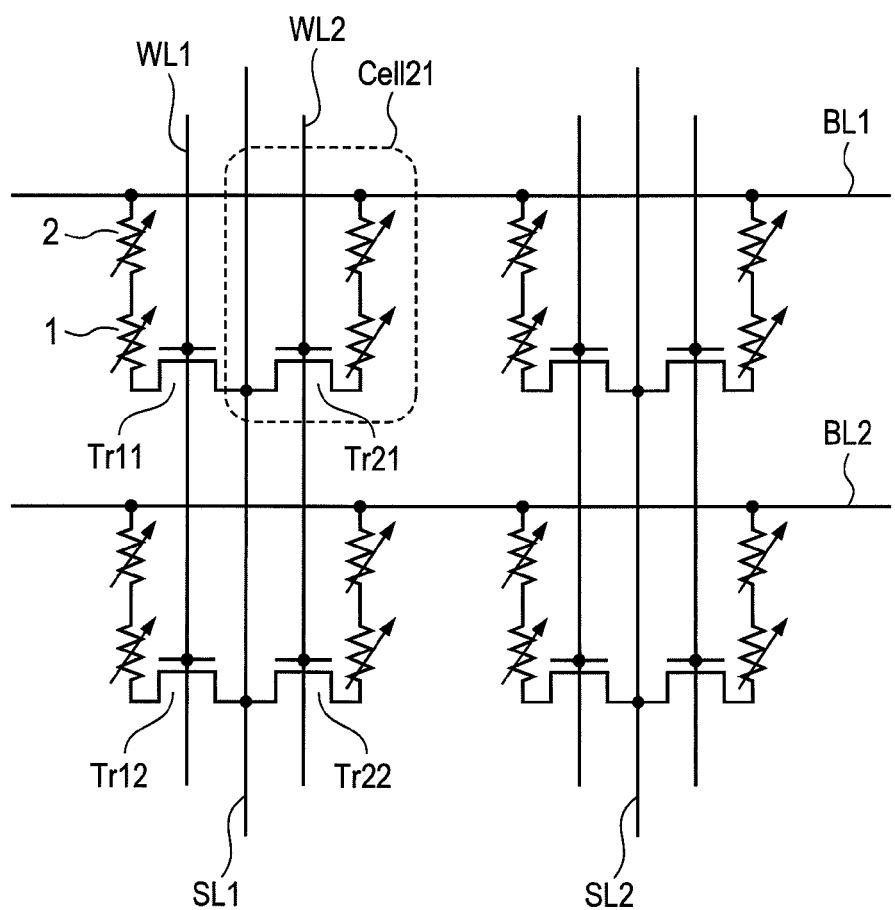
FIG. 42 is a circuit diagram of a memory cell in FIG. 41
Figure 43A:
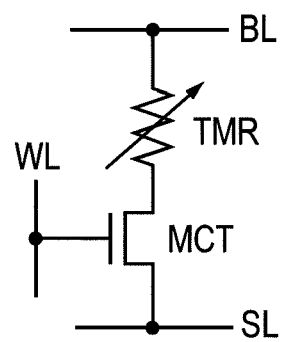
FIG. 43 (a) is a view showing a circuit diagram of a conventional element, while FIG. 43 (b) is a view showing the structure thereof.
Figure 43B:
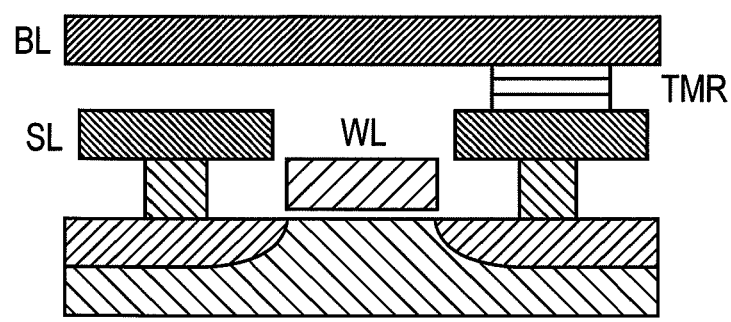

FIG. 42 is view showing a circuit configuration of a memory cell using the structure example shown in FIG. 41. For brevity, only eight units of the memory cells are depicted. A magneto-resistance effect element is depicted as variable resistance where resistance varies according to parallel-antiparallel of respective magnetization orientations in the two ferromagnetic layers. In the case of a read operation, for example, 1V is applied to WL2, and 0.2V is applied to BL1, thereby selecting a memory cell Ce 1121 to determine series resistance of the magneto-resistance effect elements 1, 2, connected in series to each other. At this point in time, 0V is applied to other WLs, BLs and SLs, whereupon other memory cells are in an unselect state. On the other hand, in the case of a write operation, for example, 1V is applied to WL2, and BL1, 0V is applied to SL1, while 0V is applied to other WLs, BLs and SLs, or 1V is applied to WL2, 0V is applied to BL1, and 1V is applied to SL1, while 0V is applied to other WLs, SLs, and 1V is applied to other BLs to thereby select the memory cell Ce 1121, whereupon the orientation of magnetization is changed by causing a current to bidirectionally flow to the magneto-resistance effect elements 1, 2, connected in series to each other. With the present embodiment, there is shown an example where the bit line orthogonally intersects the source line. As a result, a process for ensuring insulation between metal interconnections is simplified. Further, speedy transition of a memory cell on a word line to a specific rewrite state can be effected only by switching of a bit line. Further, the example of the configuration of FIG. 42 (FIG. 41) has a feature in that the source line SL is extended in parallel with the word line WL in contrast to the configuration of FIG. 40 (FIG. 7).

Thus, with the respective embodiments of the invention, so far described, explanation is based on a spin-injection write scheme, however, according to the concept of the present embodiment, it need only be sufficient to have a state where a memory element undergo a change in resistance value due to a current value, and in a plurality of the memory elements, resistances thereof, and current values necessary for writing vary as is the case with the relationship described with reference FIG. 2. Accordingly, the memory element is not limited to a TMR element. That is, referring to FIG. 2, only if a differential between binary resistance values which at least respective memory elements can take varies by the memory element {more specifically, $(RAP1-RP1) \neq (RAP2-RP2)$}, four values can be realized by combinations of the combined resistances thereof. Further, it need only be sufficient to have a state where the direction of a current at the time of writing to one of binary resistance values differ from the direction of a current at the time of writing to the other resistance value by the memory element, and current values at the time of writing a predetermined resistance value to the respective memory elements differ from each other. More specifically, as a sign differs, so does a current value, and only if $Iap1 \neq Iap2 \neq IP1 \neq IP2$, this is sufficient. Then, writing is executed to a variable-resistance type memory element having such a characteristic as described above by causing a first current at a value identical to, or hither than the maximum current as a maximum current necessary to vary the resistance of the element in a first direction, and subsequently, by causing a second current in a second direction opposite to the direction of the first current only to an extent necessary to vary a resistance state of at least one memory element among a plurality of memory elements except for the memory element requiring the maximum current.

Further, with TMR element, under a condition that the TMR elements are identical in area to each other, use is made of techniques such as varying of element resistance and a TMR ratio by changing a film thickness of an element such as a tunneling insulation layer, and so forth for every magneto-resistance effect element, or varying of a threshold current owing to the effect of shape anisotropy by changing an aspect ratio of a rectangular element, changing an element shape into that for an elliptical element, and so forth, optimization of material, and film makeup on a element-by-element basis, or use of a vertical magnetization film, thereby enabling a multi-valued operation according to the present embodiment to be realized.

Having specifically described the invention developed by the inventor, et al. on the basis of the embodiments described as above, it is to be understood that the invention be not limited to any of the embodiments, and that various changes and modifications may be made in the invention without departing from the spirit and scope thereof.

INDUSTRIAL APPLICABILITY

The semiconductor recording device according to the present embodiment relates to the field of mixed nonvolatile memories mounted therein or a single nonvolatile memory to be written many times and for which multi-valued writing can be performed.

LIST OF REFERENCE SIGNS 1, 2: magneto-resistance effect element
10, 11: lower electrode
102: ferromagnetic film
103: antiferromagnetic film
104: ferromagnetic film,
105, 107, 108: metal layer
106: ferromagnetic film
1a, 2a: ferromagnetic layer
1b, 2b: non-magnetic layer
1c, 2c: ferromagnetic layer
3: semiconductor substrate active region
5: gate oxide film
7: contact hole
8: interconnection
9: inter-layer plug
ABF: address buffer
BAR: binary region
BF: buffer
BL: bit line
BM, UM: metal layer
CRS: control circuit
CTL: control circuit
DR, DRB, DRS: write driver
FL: free layer
GB: global bit line
IO: input/output line
IOC: input/output circuit
L: latch circuit
LAM, LA: latch circuit
LC: control logic circuit
M: metal interconnection region
MA: main amplifier
MB: non-magnetic material layer
MBAR: multi-valued region
MBC: multi-values/binary-values conversion circuit
MBSW: switching circuit
MC: memory cell
MCA: memory cell array
MCT: selection transistor
MS: reference cell
PG: pulse generation circuit
PL: fixed layer
RDC: read-data conversion circuit
REG: register
RR: reference resistance
SA: sense amplifier
SALA: sense circuit-latch circuit
SL: source line
Sub: semiconductor substrate
TB: tunnel barrier film
TMR: tunnel magneto-resistance element
V: metal connection region
VGEN: internal power supply circuit
WB: bit line driver
WDC: write-data conversion circuit
WDR: word driver
WL: word line
WS: source line driver
XDEC: X-decoder
YDEC: Y-decoder
YS: Y-system select signal

The invention claimed is:

1. A semiconductor recording device comprising:
a word line extending in a first direction;
a bit line extending in a second direction intersecting the first direction;
a source line extending in the first direction, or in the second direction;
a memory cell disposed at an intersection between the word line and the bit line; and
a write circuit for driving the bit line and the source line, wherein the memory cell includes:
a switching element for forming a current path between the bit line and the source line when the word line is activated; and
first and second variable-resistance type memory elements inserted in series with the current path,
wherein application time of a current necessary for changing a resistance value of the first variable-resistance type memory element is longer than application time of a current necessary for changing a resistance value of the second variable-resistance type memory element, and a differential between resistance values of the first variable-resistance type memory element before, and after a change, respectively, differs from a differential between resistance values of the second variable-resistance type memory element before, and after a change, respectively, the write circuit executing a first operation for causing a first current to flow in a third direction on the current path, for a first period of time, and a second operation for causing a second current smaller in value than the first current to flow in a fourth direction opposite to the third direction for a second period of time shorter than the first period of time after the first operation.

2. The semiconductor recording device according to claim 1, wherein magnitude of a current caused to flow in the first operation is equal to magnitude of a current caused to flow in the second operation.

3. The semiconductor recording device according to claim 2, wherein the write circuit includes:
a second bit line driver circuit connected to the bit line, the second bit line driver circuit capable of making a choice between a current-supply operation and a current-withdrawal operation, and setting an operation period for executing the current-supply operation or the current-withdrawal operation in two steps; and
a second source line driver circuit connected to the source line, the second source line driver circuit capable of making a choice between a current-supply operation and a current-withdrawal operation, and setting an operation period for executing the current-supply operation or the current-withdrawal operation in two steps,
wherein both the second bit line driver circuit and the second source line driver circuit being set to a larger one of the operation periods, one of the circuits executing the current-supply operation and the other executing the current-withdrawal operation, in the first operation, while both the second bit line driver circuit and the second source line driver circuit being set to a smaller one of the operation periods, and in the second operation, one of the circuits executing the current-withdrawal operation, the other executing the current-supply operation.

4. The semiconductor recording device according to claim 1, wherein the memory cell further comprises a third variable-resistance type memory element inserted in series with the current path, application time of a current necessary for changing a resistance value of the third variable-resistance type memory element is shorter than application time of the current necessary for changing the resistance value of the second variable-resistance type memory element, and a differential between resistance values of the third variable-resistance type memory element, before, and after a change, respectively, differs from a differential between the respective resistance values of the first and second variable-resistance type memory elements, before, and after a change, respectively, the write circuit further executing a third operation for causing a third current smaller in value than the second current to flow in the third direction after the second operation.

5. The semiconductor recording device according to claim 1, wherein the first and second variable-resistance type memory elements are each a spin-injection magnetization-reversal tunneling magneto-resistance element.

6. The semiconductor recording device according to claim 5, wherein the first variable-resistance type memory element is identical in sectional structure to the second variable-resistance type memory element, and the first variable-resistance type memory element is larger in plane area than the second variable-resistance type memory element.

7. A semiconductor recording device comprising:
a word line extending in a first direction;
a bit line extending in a second direction intersecting the first direction;
a source line extending in the first direction, or in the second direction;
a memory cell disposed at an intersection between the word line and the bit line; and
a write circuit for driving the bit line and the source line, wherein the memory cell includes:
a switching element for forming a current path between the bit line and the source line when the word line is activated; and
first and second variable-resistance type memory elements inserted in series with the current path, wherein magnitude of a first current necessary for changing a resistance value of the first variable-resistance type memory element is larger than magnitude of a second current necessary for changing a resistance value of the second variable-resistance type memory element, and a differential between resistance values of the first variable-resistance type memory element, before, and after a change, respectively, differs from a differential between resistance values of the second variable-resistance type memory element, before, and after a change, respectively, the write circuit executing a write operation using a predetermined current against at least one of the first and second variable-resistance type memory elements, thereby providing the memory cell with a binary operation mode for storing binary information.

8. The semiconductor recording device according to claim 7, wherein the write circuit, in the binary operation mode, causes the binary information to be stored by writing with the use of the first current.

9. The semiconductor recording device according to claim 7, wherein the write circuit, in the binary operation mode, executes writing with the use of the first current, as an initialized state, subsequently, causing the binary information to be stored by continued use of the second current.

10. The semiconductor recording device according to claim 7, wherein the write circuit is further provided with a multi-valued operation mode, and the write circuit, in the multi-valued operation mode, executes a first operation whereby the first current is caused to flow in a third direction on the current path, and a second operation whereby the second current is caused to flow in a fourth direction opposite to the third direction after the first operation.

11. The semiconductor recording device according to claim 10, further comprising a register for setting whether the write circuit is operated in the binary operation mode, or in the multi-valued operation mode.

12. The semiconductor recording device according to claim 10, comprising first, and second memory regions, the respective regions including the write circuit, and a plurality of the memory cells, wherein the write circuit of the first memory region is operated in the binary operation mode, and the write circuit of the second memory region is operated in the multi-valued operation.

13. The semiconductor recording device according to claim 7, wherein the first and second variable-resistance type memory elements are each a spin-injection magnetization-reversal tunneling magneto-resistance element.

14. The semiconductor recording device according to claim 13, wherein the first variable-resistance type memory element is identical in sectional structure to the second variable-resistance type memory element, and the first variable-resistance type memory element is larger in plane area than the second variable-resistance type memory element.

* * * * *